United States Patent
Kim et al.

(10) Patent No.: US 8,652,897 B2
(45) Date of Patent: Feb. 18, 2014

(54) SEMICONDUCTOR MEMORY DEVICES AND METHODS OF FABRICATING THE SAME

(75) Inventors: Youngkuk Kim, Seoul (KR); Insang Jeon, Seoul (KR); Youngseok Kim, Seoul (KR); Young-Lim Park, Hwaseong-si (KR); Ho-Kyun An, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/337,999

(22) Filed: Dec. 27, 2011

(65) Prior Publication Data

US 2012/0171837 A1    Jul. 5, 2012

(30) Foreign Application Priority Data

Dec. 30, 2010    (KR) .................. 10-2010-0139475

(51) Int. Cl.
    *H01L 21/8238*    (2006.01)
(52) U.S. Cl.
    USPC ............. 438/210; 438/95; 438/238; 438/382; 257/E47.001
(58) Field of Classification Search
    USPC ............. 438/382, 95, 210, 238; 257/E47.001
    See application file for complete search history.

(56) References Cited

U.S. PATENT DOCUMENTS 6,821,851 B2 * 11/2004 Hergenrother et al. ....... 438/268
7,436,692 B2 * 10/2008 Pellizzer et al. ............. 365/148
2008/0122125 A1    5/2008 Zhou
2009/0127538 A1    5/2009 Ryoo et al.
2009/0189137 A1 *  7/2009 Kinoshita et al. .................. 257/2
2009/0200534 A1 *  8/2009 Rajendran et al. ................ 257/3
2010/0032637 A1 *  2/2010 Kinoshita et al. .................. 257/2
2010/0213432 A1    8/2010 Chuang et al.

FOREIGN PATENT DOCUMENTS

| JP | 2006032648 A | 2/2006 |
| KR | 20100042925 A | 4/2010 |
| KR | 20100081514 A | 7/2010 |

* cited by examiner

*Primary Examiner* — Michael Trinh
(74) *Attorney, Agent, or Firm* — Harness, Dickey & Pierce, P.L.C.

(57) ABSTRACT

Provided are semiconductor memory devices and the methods of fabricating the same. The method may include forming a plurality of diode patterns in each of a plurality of first trenches, each of the plurality of first trenches including at least two active regions, the plurality of diode patterns occupying a plurality of spaces, treating the plurality of diode patterns to form a plurality of semiconductor patterns in each of the plurality of spaces, removing portions of the plurality of semiconductor patterns to form a recess in each of the plurality of spaces, treating the of the plurality of semiconductor patterns to form a plurality of diodes in each of the plurality of spaces, forming a bottom electrode on each of the plurality of diodes, forming a plurality of memory elements on each of the bottom electrodes, and forming a plurality of upper interconnection lines on the plurality of memory elements.

54 Claims, 37 Drawing Sheets

SEMICONDUCTOR MEMORY DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2010-0139475, filed on Dec. 30, 2010, in the Korean Intellectual Property Office, the entire contents of which are hereby incorporated by reference.

BACKGROUND

Example embodiments of inventive concepts relate generally to semiconductor devices. More particularly, example embodiments of inventive concepts relate to semiconductor memory devices and methods of fabricating the same.

With the development of the electronics industry including, for example, mobile communications and computers, the demand for semiconductor devices having characteristics such as rapid read/write speed, nonvolatility, and/or lower operating voltage has increased. However, current memory devices, such as static random access memory (SRAM), dynamic random access memory (DRAM), and a flash memory, may not satisfy one or more of these requirements.

For example, as a unit cell of a DRAM typically includes a single capacitor and a single transistor for controlling the capacitor, a unit cell of a DRAM may require a larger area than a unit cell of a NAND flash memory. Moreover, a DRAM, which stores data in the capacitor, is a volatile memory device that needs a refresh operation. Further, an SRAM operates at high speed, but it is also a volatile memory device. Additionally, a unit cell of an SRAM may include 6 transistors, so a unit cell or an SRAM may also occupy a large area. Further, although flash memory is a nonvolatile memory device and (especially, for example, the NAND flash memory) has the highest integration density of presently discussed memory devices, flash memory operates at lower speed.

For at least the above-mentioned reasons, there have been extensive studies on new memory devices, which are capable of faster read/write operations, exhibit nonvolatility, need no refresh operations, and operate at lower voltage. A phase random access memory (PRAM), a magnetic RAM (MRAM) or a resistive RAM (ReRAM) are the next generation memory devices, which are candidates to satisfy the aforementioned technical requirements.

Conventional PRAMs generally include diodes or other rectifying devices, which may be formed by selective epitaxial growth. Conventional PRAM diodes do not use amorphous silicon because when amorphous silicon is filled in a narrow contact area (for example, a contact area with an aspect ratio greater than 10), seams are present in the contact area. A fabrication technology capable of realizing a memory capacity required from the market should be prepared so as to send these next generation memory devices into mass production.

SUMMARY

Example embodiments of inventive concepts provide semiconductor devices offering higher capacity and/or improved reliability.

Example embodiments of inventive concepts provide fabrication methods for increasing memory capacity and/or reliability of semiconductor devices.

According to example embodiments of inventive concepts, a method of forming a semiconductor memory device may include forming a plurality of diode patterns in each of a plurality of first trenches, each of the plurality of first trenches including at least two active regions, the plurality of diode patterns occupying a plurality of spaces, treating the plurality of diode patterns to form a plurality of semiconductor patterns in each of the plurality of spaces, removing portions of the plurality of semiconductor patterns to form a recess in each of the plurality of spaces, treating the of the plurality of semiconductor patterns to form a plurality of diodes in each of the plurality of spaces, forming a bottom electrode on each of the plurality of diodes, forming a plurality of memory elements on each of the bottom electrodes, and forming a plurality of upper interconnection lines on the plurality of memory elements.

In example embodiments, the plurality of diodes are in the plurality of spaces, but not in the plurality of recesses.

In example embodiments, each of the bottom electrodes are in each of the plurality of recesses.

In example embodiments, the plurality of memory elements are in the plurality of recesses.

In example embodiments, the plurality of memory elements are on the plurality of recesses.

In example embodiments, the plurality of memory elements are separated by a plurality of interlayer insulating patterns.

In example embodiments, the method may further include forming a plurality of device isolation patterns and the plurality of active regions, the plurality of device isolation patterns being alternately disposed to expose an upper surface of at least two of the plurality of active regions within each of the plurality of first trenches, conformally forming a semiconductor layer on the plurality of device isolation patterns and the plurality of first trenches, and removing portions of the semiconductor layer to form the plurality of diode patterns on the upper surface of the at least two of the plurality of active regions within each of the plurality of first trenches.

In example embodiments, the semiconductor layer is made of amorphous silicon.

In example embodiments, the method may further include annealing the semiconductor layer to form a crystalline semiconductor layer.

In example embodiments, the annealing of the semiconductor layer is performed at a temperature of 500-700 C.

In example embodiments, the method may further include forming a capping layer on a semiconductor layer and forming a plurality of spacers on at least a portion of the sidewalls of the plurality of diode patterns from the capping layer.

In example embodiments, the method may further include etching a bottom of the semiconductor layer exposed between the plurality of spacers.

In example embodiments, the method may further include annealing the semiconductor layer and the capping layer.

In example embodiments, the annealing is performed at a temperature of 500-700 C.

In example embodiments, the capping layer is formed of at least one of SiO2, SiON, a metal oxide, or a metal oxynitride.

In example embodiments, the method may further include removing the plurality of spacers.

In example embodiments, the method may further include forming a plurality of first gap-fill patterns in the plurality of first trenches, removing portions of the plurality of device isolation patterns, the plurality of diode patterns, and the plurality of first gap-fill patterns to form a plurality of second trenches, perpendicular to the plurality of first trenches, forming a plurality of second gap-fill patterns in the plurality of second trenches, and forming upper regions and lower regions of the plurality of semiconductor patterns to have different conductivity types to form a plurality of diodes.

In example embodiments, the method may further include forming a plurality of upper trenches along the plurality of device isolation patterns, forming a plurality of upper gap-fill patterns in the plurality of upper trenches, forming the plurality of memory elements separated by a plurality of interlayer insulating patterns on the plurality of upper gap-fill patterns, and forming the plurality of upper interconnection lines on the plurality of memory elements.

In example embodiments, forming the plurality of electrode structures includes forming a plurality of pillar type bottom electrodes in an interlayer dielectric layer.

In example embodiments, the method may further include forming a plurality of device isolation patterns, a plurality of device isolation masks, and the plurality of active regions, separated by the plurality of device isolation patterns, on a substrate by shallow trench isolation, removing a subset of the plurality of device isolation patterns and the plurality of isolation masks within the plurality of first trenches to expose an upper surface of at least two of the plurality of active regions and an upper surface of the removed device isolation pattern within each of the plurality of first trenches, conformally forming a semiconductor layer on the remaining plurality of device isolation patterns and the plurality of first trenches, and removing portions of the semiconductor layer to form the plurality of diode patterns on the upper surface of the at least two of the plurality of active regions within each of the plurality of first trenches and to expose the upper surface of the removed device isolation pattern within each of the plurality of first trenches.

In example embodiments, the semiconductor layer is made of amorphous silicon.

In example embodiments, the method may further include annealing the semiconductor layer to form a crystalline semiconductor layer.

In example embodiments, the annealing of the semiconductor layer is performed at a temperature of 500-700° C.

In example embodiments, the plurality of active regions act as seed regions to form the crystalline semiconductor layer.

In example embodiments, the method may further include forming a plurality of first gap-fill patterns in the remainder of each of the plurality of first trenches, removing portions of the remaining plurality of device isolation patterns, the plurality of diode patterns, and the plurality of first gap-fill patterns to form a plurality of second trenches, perpendicular to the plurality of first trenches, forming a plurality of second gap-fill patterns in the plurality of second trenches, removing upper portions of the plurality of semiconductor patterns to form the plurality of recesses, forming upper regions and lower regions of the plurality of semiconductor patterns to have different conductivity types to form the plurality of diodes, and forming a plurality of electrode structures on the plurality of diodes.

In example embodiments, the method may further include forming a plurality of upper trenches along the plurality of device isolation patterns, forming a plurality of upper gap-fill patterns in the plurality of upper trenches, forming the plurality of memory elements separated by a plurality of interlayer insulating patterns on the plurality of upper gap-fill patterns, and forming the plurality of upper interconnection lines on the plurality of memory elements.

In example embodiments, forming the plurality of electrode structures includes forming a plurality of pillar type bottom electrodes in an interlayer dielectric layer.

In example embodiments, the method may further include forming a plurality of device isolation patterns and the plurality of active regions, separated by the plurality of device isolation patterns on a substrate by shallow trench isolation, forming a plurality of mold patterns on a subset of the plurality of device isolation patterns to define the plurality of first trenches, an upper surface of at least two of the plurality of active regions and an upper surface of the remaining device isolation pattern being within each of the plurality of first trenches, conformally forming a semiconductor layer on the plurality of mold patterns and the plurality of first trenches, and removing portions of the semiconductor layer to form the plurality of diode patterns on the upper surface of the at least two of the plurality of active regions within each of the plurality of first trenches and to expose the upper surface of the remaining device isolation pattern within each of the plurality of first trenches.

In example embodiments, a thickness of the device isolation pattern is 50 to 200% of the depth of the device isolation trench.

In example embodiments, a thickness of the device isolation pattern is the same as a depth of the device isolation trench.

In example embodiments, the method may further include forming a plurality of spacers on sidewalls of the plurality of diode patterns, forming a plurality of first gap-fill patterns in the plurality of first trenches, removing portions of the remaining plurality of device isolation patterns, the plurality of diode patterns, and the plurality of first gap-fill patterns to form a plurality of second trenches, perpendicular to the plurality of first trenches, forming a plurality of second gap-fill patterns in the plurality of second trenches, forming an interlayer dielectric layer including a plurality of electrodes structures, each of the plurality of electrode structures including a pad pattern connected to each of the plurality of semiconductor patterns and a electrode pattern on the corresponding pad pattern, wherein an upper surface of the plurality of electrode patterns are exposed, forming the plurality of memory elements separated by a plurality of interlayer insulating patterns on the interlayer dielectric layer.

In example embodiments, the method may further include forming a plurality of mold patterns, with the plurality of first trenches between adjacent ones of plurality of mold patterns, on an active layer on a substrate, conformally forming a semiconductor layer on the plurality of mold patterns and the active layer, forming gap-fill patterns in a remainder of each of the plurality of first trenches, removing upper portions of the semiconductor layer and the gap-fill patterns to expose an upper surface of each of the plurality of mold patterns, removing upper portions of the semiconductor layer to form a plurality of gap regions, forming a plurality of capping patterns in the plurality of gap regions, and removing the gap-fill patterns, portions of the plurality of mold patterns, portions of the active layer thereunder, and portions of the substrate thereunder by shallow trench isolation to form the plurality of diode patterns.

In example embodiments, the active layer covers the substrate.

In example embodiments, the active layer is doped to have a conductivity type opposite from the conductivity type of the substrate.

In example embodiments, the substrate under regions of the gap-fill patterns and the plurality of mold patterns are etched to different depths.

In example embodiments, the method may further include forming an insulation layer on a substrate to form a silicon-on-insulator (SOI) structure, forming a plurality of interconnection lines in the insulation layer, forming a plurality of mold patterns on a subset of exposed portions of the insulation layer to define the plurality of first trenches, an upper surface of at least two of the plurality of interconnection lines and an upper surface of the remaining exposed portions of the insulation layer being within each of the plurality of first trenches, conformally forming a semiconductor layer on the plurality of interconnection lines and the plurality of first trenches, and removing portions of the semiconductor layer to form the plurality of diode patterns on the upper surface of the at least two of the plurality of interconnection lines within each of the plurality of first trenches and to expose the upper surface of insulation layer within each of the plurality of first trenches.

According to example embodiments of inventive concepts, a method of forming a memory device may include disposing a semiconductor layer in a plurality of first trenches on a substrate, annealing the semiconductor layer, patterning the semiconductor layer to form a plurality of semiconductor patterns, forming upper regions and lower regions of the plurality of semiconductor patterns to have different conductivity types to form a plurality of diodes, and forming an electrode on the plurality of diodes with a memory element thereon.

According to example embodiments of inventive concepts, a semiconductor memory device may include a substrate including a plurality of active regions separated by a plurality of device isolation patterns, a plurality of diodes on the plurality of active regions, adjacent ones of the plurality of diodes separated by the plurality of device isolation patterns in one direction, a plurality of bottom electrodes on the plurality of diodes, adjacent ones of the plurality of bottom electrodes separated by the plurality of device isolation patterns, a plurality of memory elements on the plurality of bottom electrodes adjacent ones of the plurality of memory elements separated by a plurality of interlayer insulating patterns, and a plurality of upper interconnection lines on the plurality of memory elements.

In example embodiments, the plurality of device isolation patterns and the plurality of field isolation patterns are aligned.

In example embodiments, the plurality of diodes are separated by the plurality of device isolation patterns in one direction and a plurality of gap-fill patterns in the other directions.

In example embodiments, the plurality of diodes are separated by a plurality of mold patterns in one direction and a plurality of gap-fill patterns in the other directions.

According to example embodiments of inventive concepts, a memory device may include a plurality of pairs of diodes, each pair of the plurality of pairs of diodes having a "V-shape".

In example embodiments, each diode of the plurality of pairs of diodes has substantially parallel opposite side walls.

In example embodiments, the substantially parallel opposite side walls are the inside and outside sidewalls.

In example embodiments, treating the plurality of diode pattern comprises thermally treating the plurality of diode patterns.

In example embodiments, the thermally treating crystallizes the plurality of diode patterns.

In example embodiments, the thermally treating includes heating or annealing.

In example embodiments, the annealing is laser annealing.

In example embodiments, the thermally treating is performed in a temperature range of about 500-700 C.

In example embodiments, the thermally treating is performed in a nitrogen or an oxygen/nitrogen atmosphere.

In example embodiments, during the thermally treating, impurities from a doped region, diffuse into the plurality of diode patterns to form the plurality of semiconductor patterns.

In example embodiments, treating the remainder of the plurality of semiconductor patterns includes implanting ions into an upper region of the plurality of semiconductor patterns to form the plurality of diodes.

In example embodiments, a substrate and upper regions of the plurality of semiconductor patterns have a first conductivity type and lower regions of the plurality of semiconductor patterns have a second conductivity type.

In example embodiments, the first conductivity type is n-type and the second conductivity type is p-type.

In example embodiments, the first conductivity type is p-type and the second conductivity type is n-type.

In example embodiments, a plurality of device isolation patterns are field isolation patterns and the plurality of first gap-fill patterns are upper device isolation patterns In example embodiments, the plurality of device isolation patterns and the plurality of first gap-fill patterns are aligned.

In example embodiments, a plurality of device isolation patterns are field isolation patterns and the plurality of first gap-fill patterns are upper device isolation patterns.

In example embodiments, the plurality of device isolation patterns and the plurality of first gap-fill patterns are aligned.

In example embodiments, a plurality of device isolation patterns are field isolation patterns and the plurality of first gap-fill patterns are upper device isolation patterns.

In example embodiments, the plurality of device isolation patterns and the plurality of first gap-fill patterns are a single body.

BRIEF DESCRIPTION OF THE DRAWINGS

Example embodiments will be more clearly understood from the following brief description taken in conjunction with the accompanying drawings.

FIGS. 1 through 10 are perspective views illustrating methods of fabricating semiconductor devices according to example embodiments of inventive concepts;

FIG. 11 is a perspective view illustrating methods of forming a first trench according to example embodiments of inventive concepts;

FIGS. 12 through 18 are perspective views illustrating methods of fabricating semiconductor devices according to example embodiments of inventive concepts;

FIGS. 19 through 25 are perspective views illustrating methods of fabricating semiconductor devices according to example embodiments of inventive concepts;

FIGS. 26 through 32 are partial perspective views illustrating semiconductor devices according to example embodiments of inventive concepts;

FIGS. 33 and 34 are a sectional view and a graph provided for illustrating some aspects of semiconductor devices according to example embodiments of inventive concepts, respectively;

FIG. 35 is a schematic diagram provided for illustrating other aspects of semiconductor devices according to example embodiments of inventive concepts; and FIGS. 36 and 37 are diagrams schematically illustrating electronic devices including a semiconductor device according to example embodiments of inventive concepts.

Figure 1:
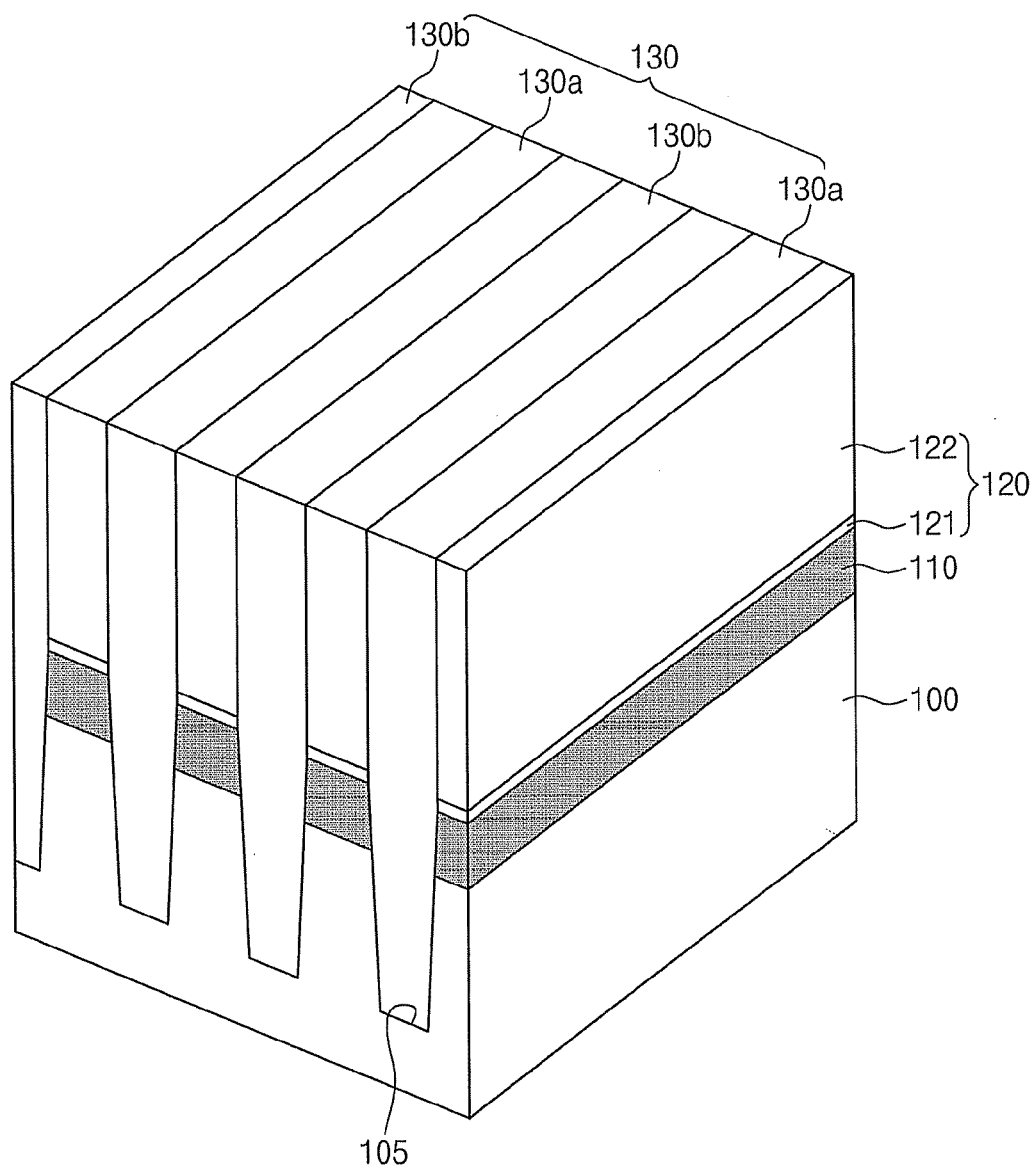
FIGS. 1-37 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 9:
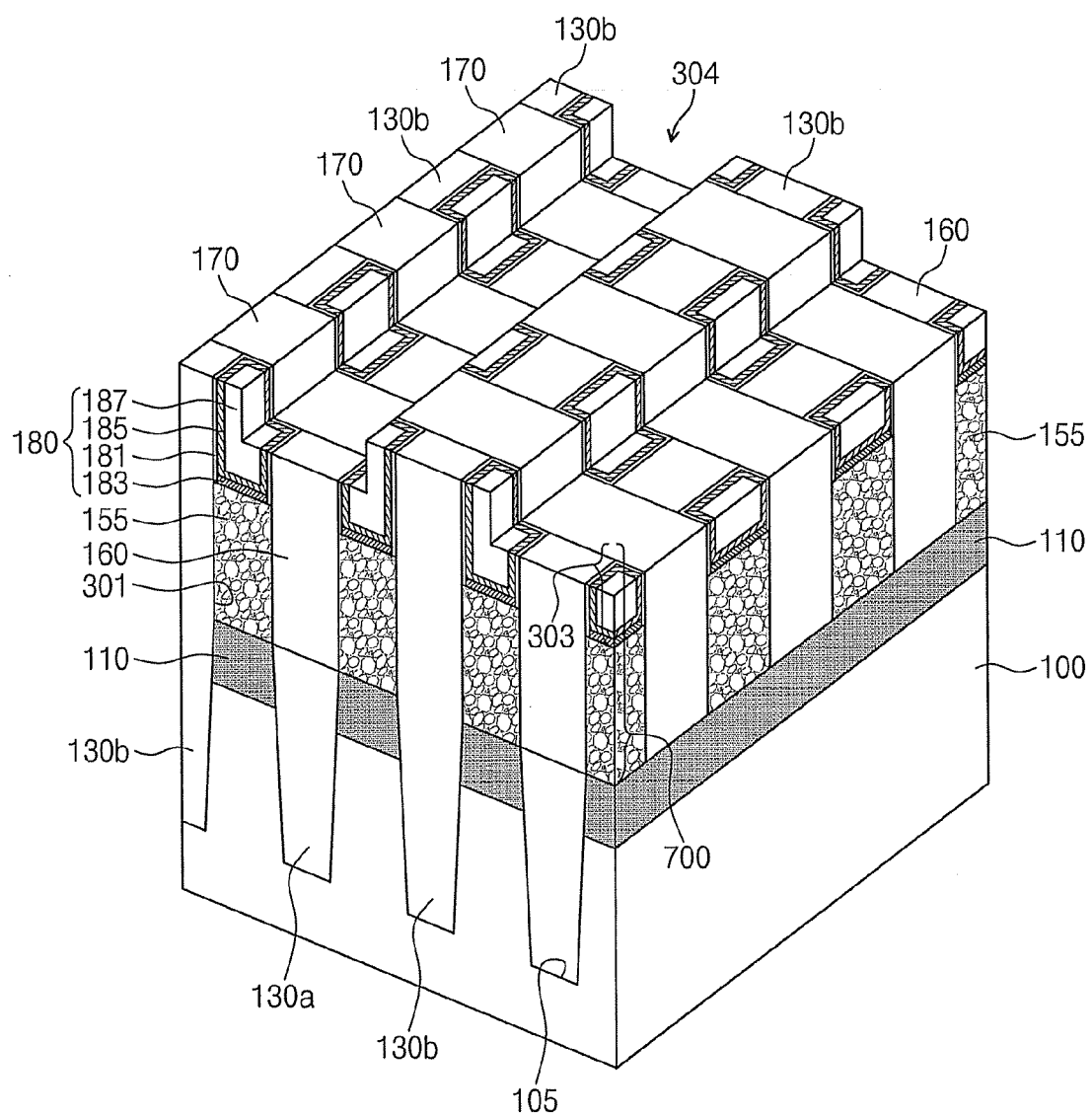
Figure 10:
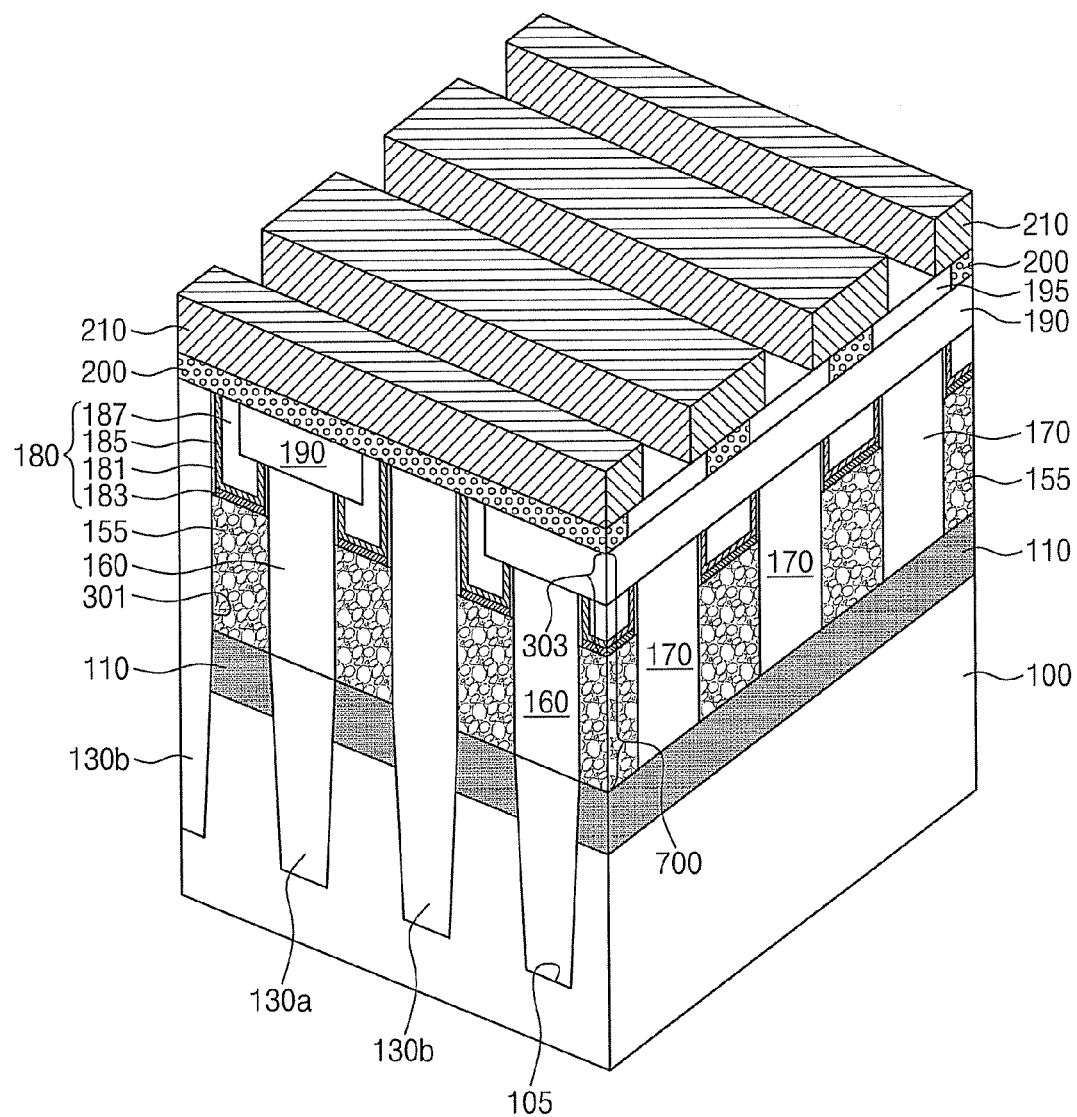
Figure 11:
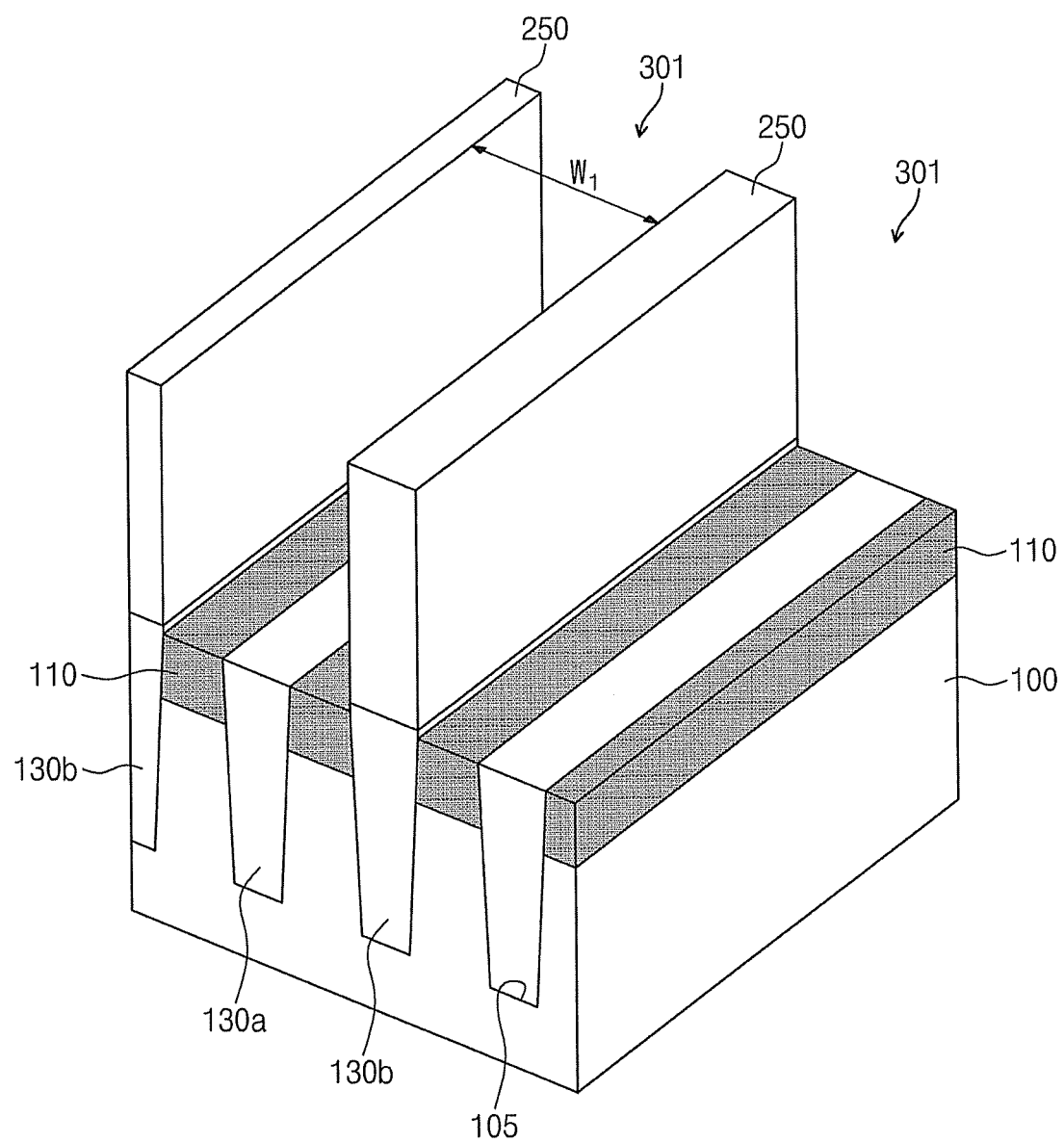

FIGS. 1 through 10 are perspective views illustrating methods of fabricating semiconductor devices according to example embodiments of inventive concepts, and FIG. 11 is a perspective view illustrating methods of forming a first trench according to example embodiments of inventive concepts.

Referring to FIG. 1, device isolation trenches 105 may be formed in desired or predetermined regions of a substrate 100 to define active regions, and device isolation patterns 130 may be formed to fill the device isolation trenches 105.

According to example embodiments of inventive concepts, the forming of the device isolation trenches 105 may include forming device isolation masks 120 on the active regions and anisotropically etching the substrate 100 using the device isolation masks 120 as an etch-mask. The device isolation mask 120 may include first and second masks 121 and 122 (or more than two masks) stacked sequentially. In example embodiments, the first mask 121 may be formed of silicon oxide, and the second mask 122 may be formed of silicon nitride. Moreover, the first mask 121 may be formed to a thickness in a range of several tens to several hundreds angstroms, and the second mask 122 may be formed to a thickness in a range of several hundreds to several thousands angstroms.

The forming of the device isolation pattern 130 may include filling the device isolation trench 105 with an insulating material. The insulating material for the device isolation pattern 130 may be at least one of a silicon oxide layer or low-k dielectrics, where the low-k dielectrics may be insulating materials having a lower dielectric constant than silicon oxide. In addition, the forming of the device isolation pattern 130 may further include forming a liner structure (not shown) covering an inner wall of the device isolation trench 105. The liner structure may include a thermal oxide, which may be formed by thermally oxidizing the inner wall of the device isolation trench 105, and a nitride liner conformally covering a resultant structure with the thermal oxide.

A doped region 110 may be further formed in an upper region of the substrate 100. The doped region 110 may be formed to have a conductivity type different from that of the substrate 100. For example, when the substrate 100 is formed of a p-type semiconductor material, forming of the doped region 110 may include doping the substrate 100 with n-type impurities (for example at high concentration). In example embodiments, the forming of the doped region 110 may be followed by the forming of the device isolation trenches 105. However, in other example embodiments, the forming of the doped region 110 may be preceded by the forming of the device isolation trenches 105. For example, the formation of the doped region 110 may be performed after forming first trenches 301, which will be described with reference to FIG. 2.

Figure 2:
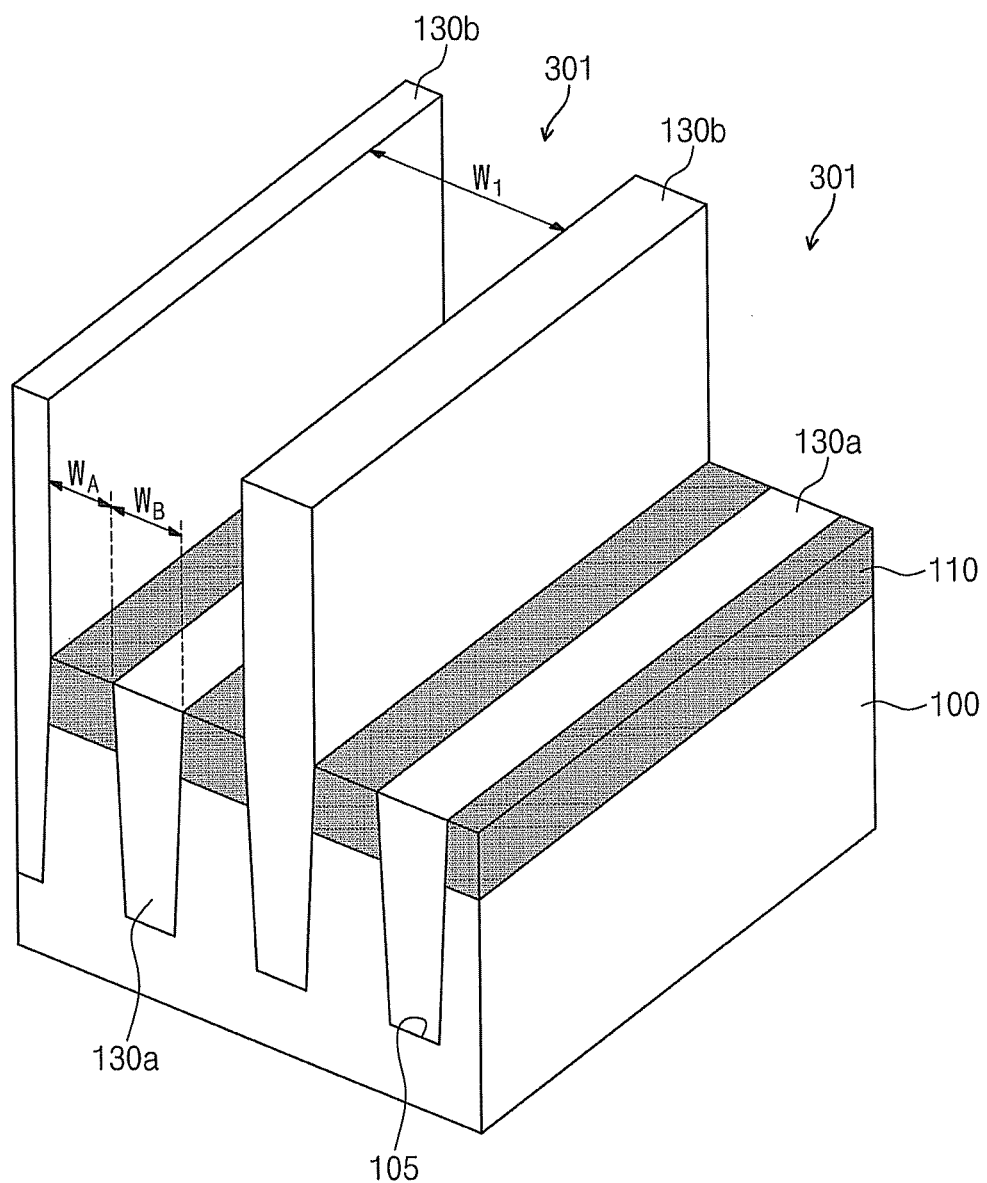

Referring to FIG. 2, first trenches 301 may be formed between some of the device isolation patterns 130, for example, even-numbered ones 130b of the device isolation patterns 130. For example, the forming of the first trenches 301 may include removing the device isolation masks 120 between the device isolation patterns 130 and upper regions of odd-numbered ones 130a of the device isolation patterns 130. Thus, inner sidewalls of the first trenches 301 may be defined by exposed sidewalls of the even-numbered device isolation patterns 130b. In addition, a bottom surface of the first trench 301 may be defined by top surfaces of a pair of the active regions and a remaining top surface of the odd-numbered device isolation patterns 130a, which are exposed by the removal of the device isolation masks 120.

A width $W_1$ of the first trench 301 may be approximately equal to the sum of the sum $2W_A$ of widths of the pair of active regions and a width $W_B$ of the top surface of the odd-numbered device isolation pattern 130a: that is, $W_1 \sim 2W_A + W_B$. However, the sidewalls of the even-numbered device isolation patterns 130b may be etched during the formation of the first trenches 301, and in this case, the width $W_1$ of the first trench 301 may be greater than the aforementioned expression, e.g., $2W_A + W_B$.

Figure 3:
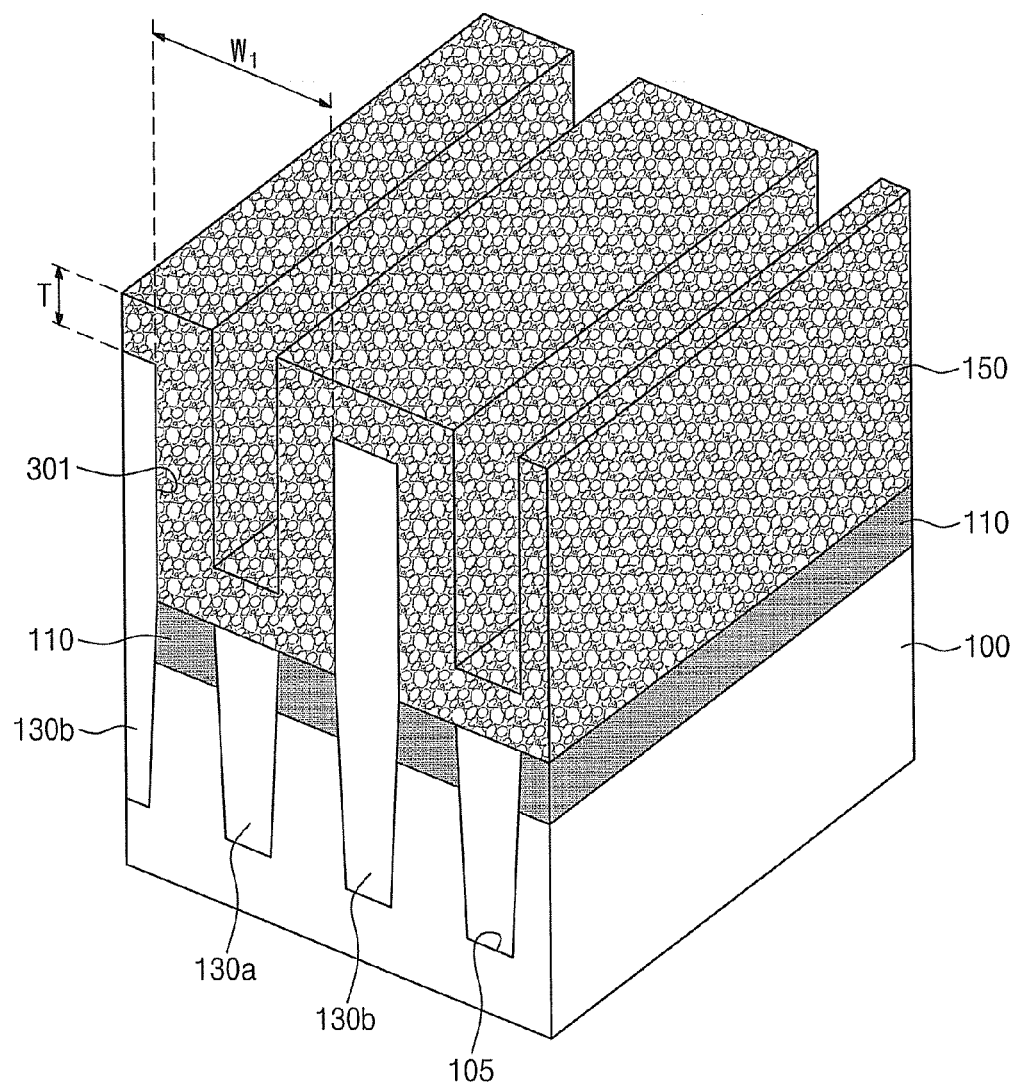

Referring to FIG. 3, a semiconductor layer 150 may be formed to conformally cover the inner wall of the first trench 301. For example, the semiconductor layer 150 may conformally cover sidewalls and top surfaces of the even-numbered device isolation patterns 130b and a bottom surface of the first trench 301.

In example embodiments of inventive concepts, the phrase "conformally covering" or "conformally forming" may mean that a layer, for example, the semiconductor layer 150, follows the contour of the underlying structure and has a uniform thickness or follows the contour of the underlying structure, but does not necessarily have a uniform thickness.

The semiconductor layer 150 may be formed using at least one of a physical vapor deposition (PVD), a thermal chemical vapor deposition (CVD), a low pressure CVD (LP-CVD), a plasma enhanced CVD (PE-CVD), or an atomic layer deposition (ALD) at temperatures below the temperature of 550° C. For example, the semiconductor layer 150 may be an amorphous silicon layer formed by physical vapor deposition (PVD) techniques, such as sputtering. According to example embodiments, the forming of the semiconductor layer 150 may be performed in a temperature range of about 350° C. to about 500° C.

The substrate 100 may further include a peripheral circuit region (not shown), on which peripheral circuits may be formed, in addition to the cell array region illustrated in the drawings. The peripheral circuits may include control circuits configured to control operations of memory cells in the cell array region, and connection circuits configured to connect the control circuits to the memory cells or input/output signal lines.

According to example embodiments, the peripheral circuits may include metal-oxide-semiconductor field effect transistors (MOSFETs), which are formed in the peripheral circuit region before the formation of the semiconductor layer 150. In example embodiments, if the semiconductor layer 150 is formed at temperatures below the temperature of 550° C. as described above, then the MOSFETs for the peripheral circuits may not suffer from technical difficulties, e.g., a short channel effect, which may occur from thermal diffusion of doped impurities.

The semiconductor layer 150 may be deposited to have poor step coverage, when the semiconductor layer 150 is formed at low temperature. However, because the width $W_1$ of the first trench 301 is greater than the width $W_A$ of the active region as explained above, technical difficulties due to the poor step coverage, such as an over-hang, a seam, or a void, may be reduced or prevented. For example, a deposition thickness T of the semiconductor layer 150 may be less than half of the width W1 of the first trench 301 (e.g., $T < W_1/2$). According to example embodiments, the deposition thickness T of the semiconductor layer 150 may be about 0.5-1.3 times of the width $W_A$ of the active region. In example embodiments, the deposition thickness of the semiconductor layer 150 may be less than the width $W_1$ of the first trench 301. Thus, even if the semiconductor layer 150 is formed using deposition techniques providing a poor step coverage property, the deposition techniques can cover the inner wall of the first trench 301 without an over-hang, a seam, or a void. According to example embodiments of inventive concepts, the width $W_1$ of the first trench 301 may be at least 3 times greater than a minimum feature size of a pattern, which may be realized using a lithography process.

Figure 4:
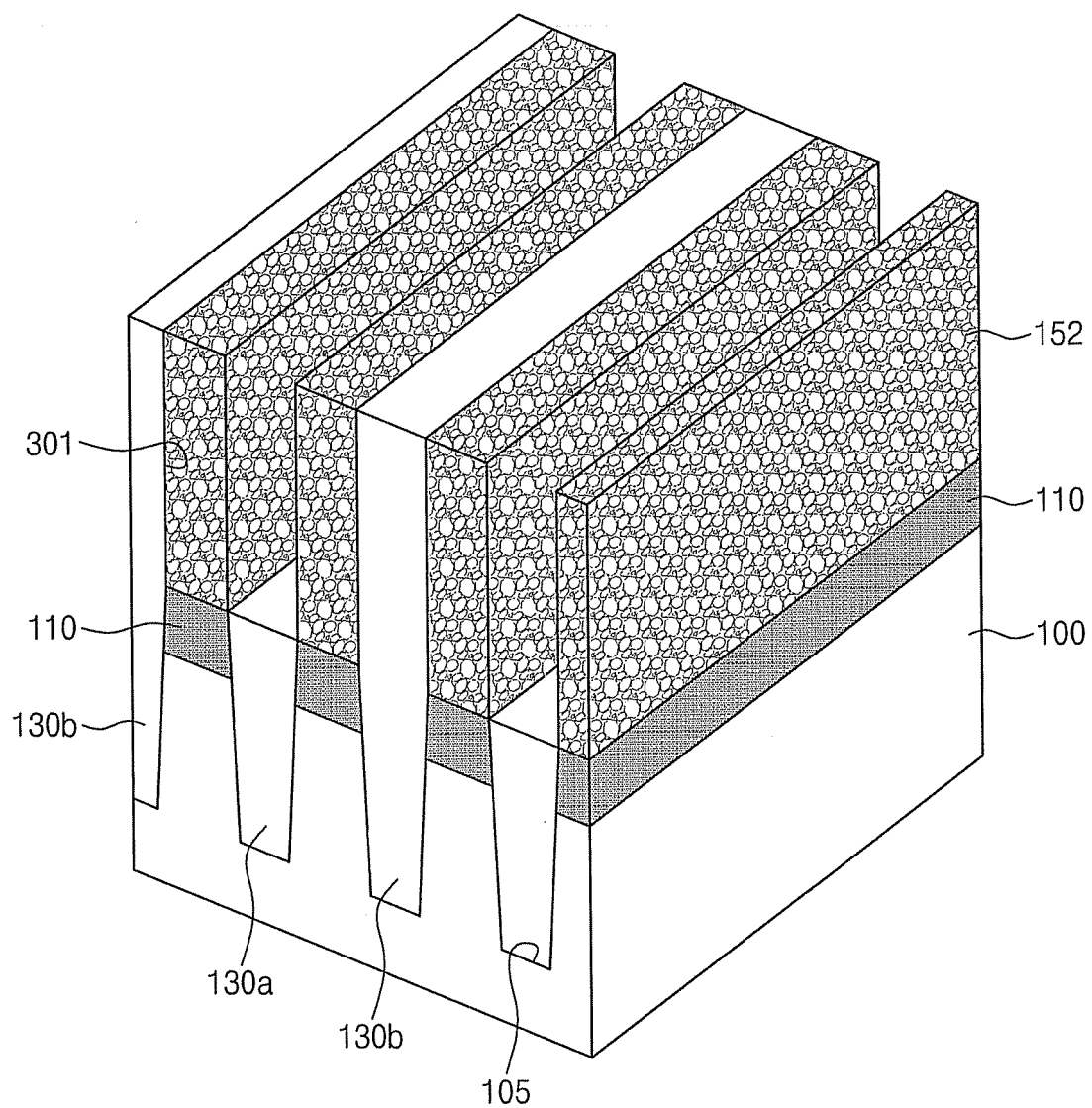

Referring to FIG. 4, the semiconductor layer 150 may be anisotropically etched to form semiconductor spacers 152 (also referred to as diode patterns) exposing bottom surfaces of the first trenches 301. The semiconductor spacers 152 may be formed on sidewalls of the even-numbered device isolation patterns 130b, to expose top surfaces of the odd-numbered device isolation patterns 130a.

Figure 5:
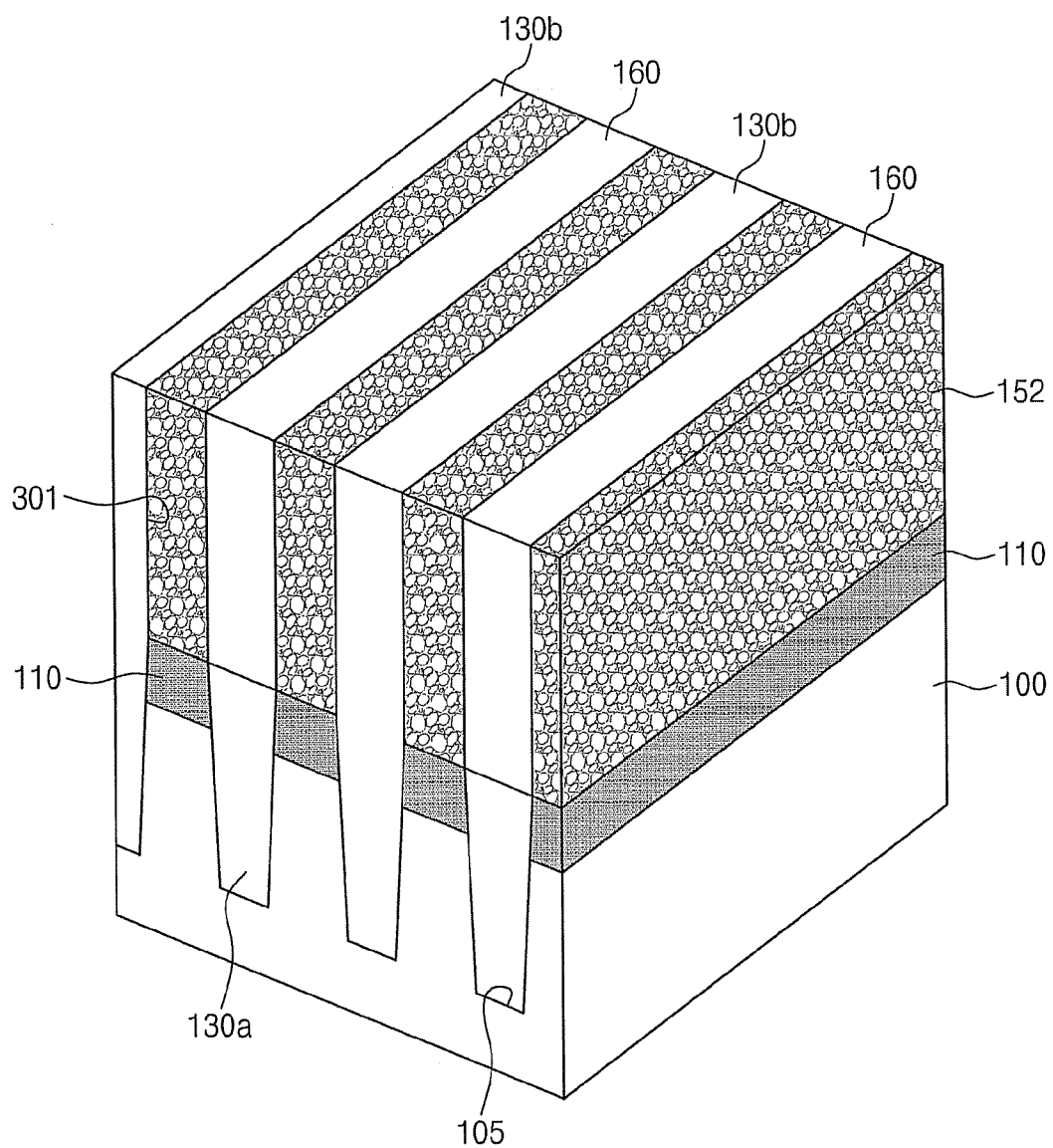

Referring to FIG. 5, first gap-fill patterns 160 may be formed to fill gap regions between the semiconductor spacers 152. That is, the first gap-fill pattern 160 may fill a remaining space of the first trench 301, which are not filled with the semiconductor spacers 152. The first gap-fill pattern 160 may be formed of insulating material. For example, the first gap-fill pattern 160 may include at least one of a silicon oxide layer or low-k dielectric layers. The forming of the first gap-fill patterns 160 may include forming a first gap-fill layer (not shown) to fill the first trench 301 provided with the semiconductor spacers 152 therein and planarizing the first gap-fill layer to expose top surfaces of the even-numbered device isolation patterns 130b. In example embodiments, the oddand even-numbered device isolation patterns 130a, 130b act as lower device isolation patterns or field isolation patterns, whereas the first gap-fill patterns 160 act as upper device isolation patterns. In example embodiments, the field isolation patterns (for example, the odd-numbered device isolation patterns 130a) and the upper device isolation patterns (for example, the first gap-fill patterns 160) are aligned. In example embodiments, the field isolation patterns (for example, the even-numbered device isolation patterns 130b) and the upper device isolation patterns (for example, the even-numbered device isolation patterns 130b) are a single unit or body.

Figure 6:
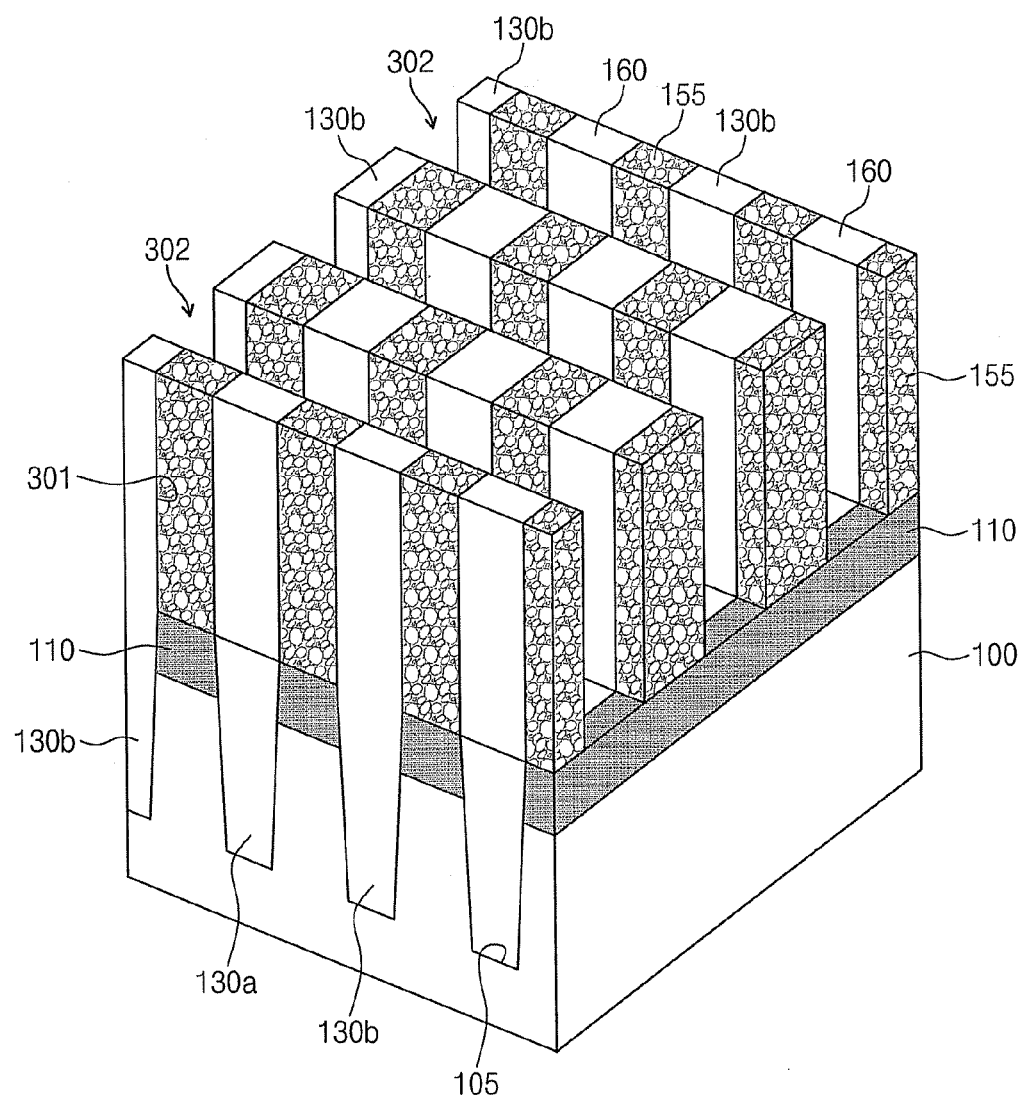

Referring to FIG. 6, the semiconductor spacers 152 and the first gap-fill patterns 160 may be patterned to form second trenches 302 crossing the first trenches 301. Thus, the semiconductor spacers 152 may be cut by the second trenches 302, thereby forming semiconductor patterns 155 (for example, rectangular in shape) whose sidewalls are defined by the second trenches 302.

Figure 26:
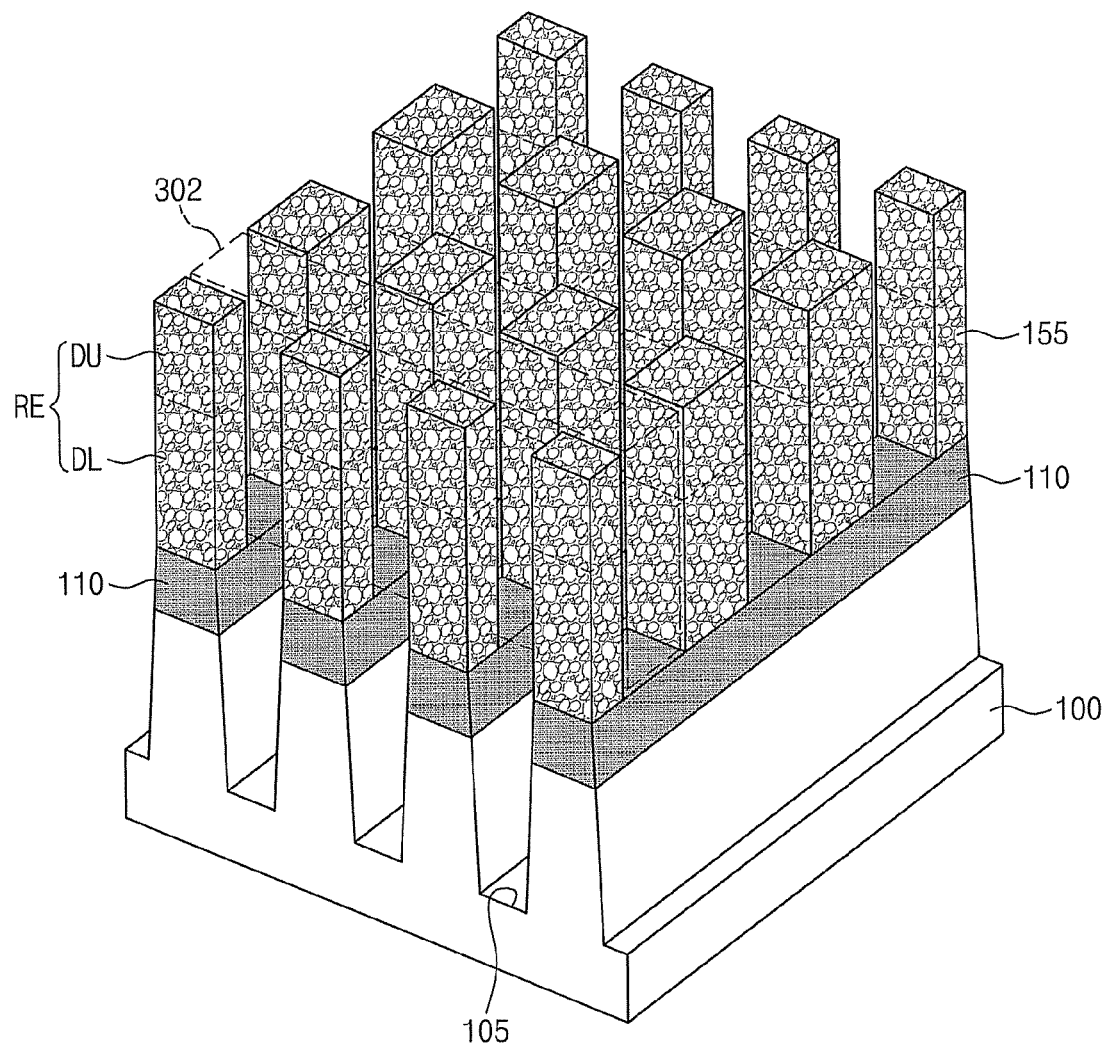
Figure 27:
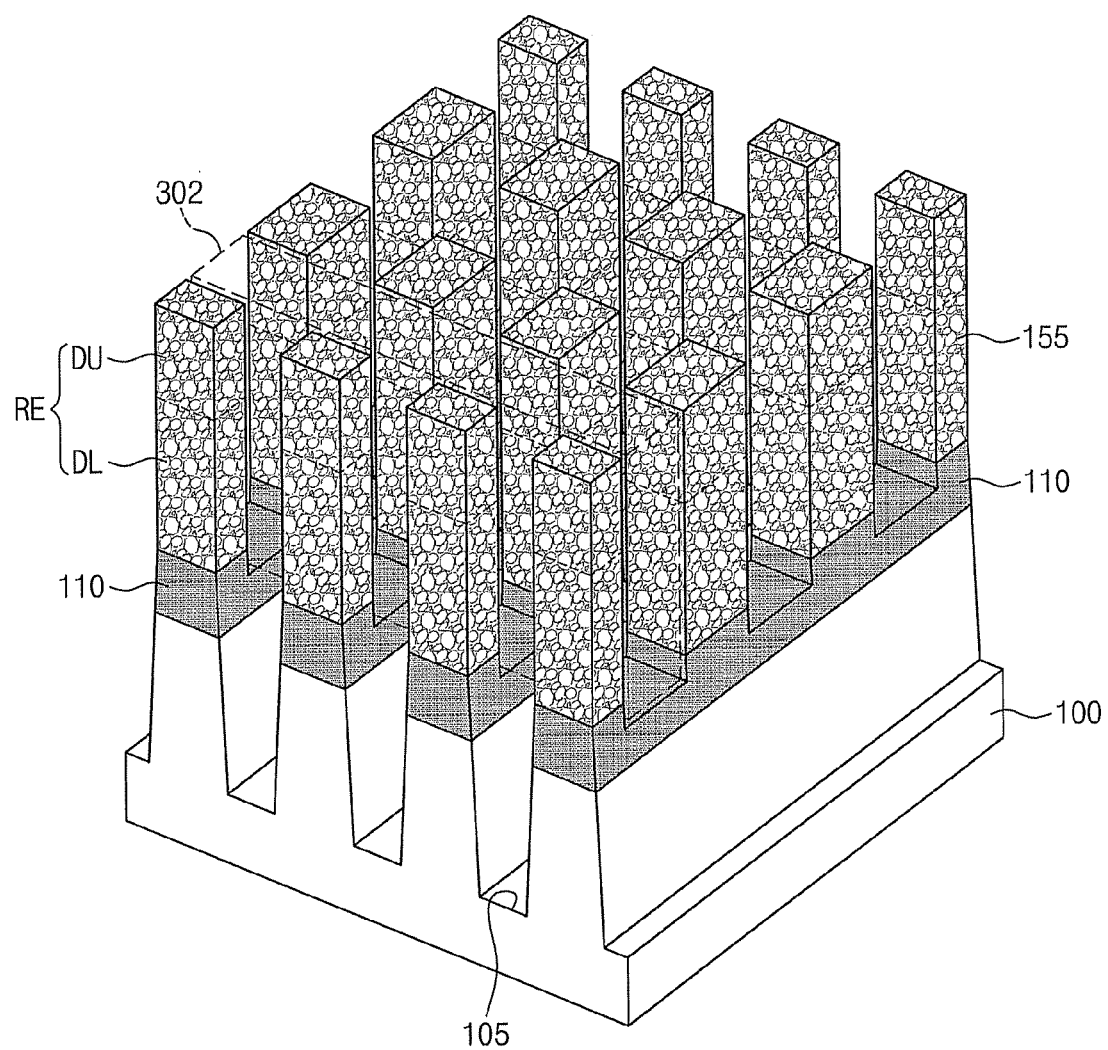
Figure 28:
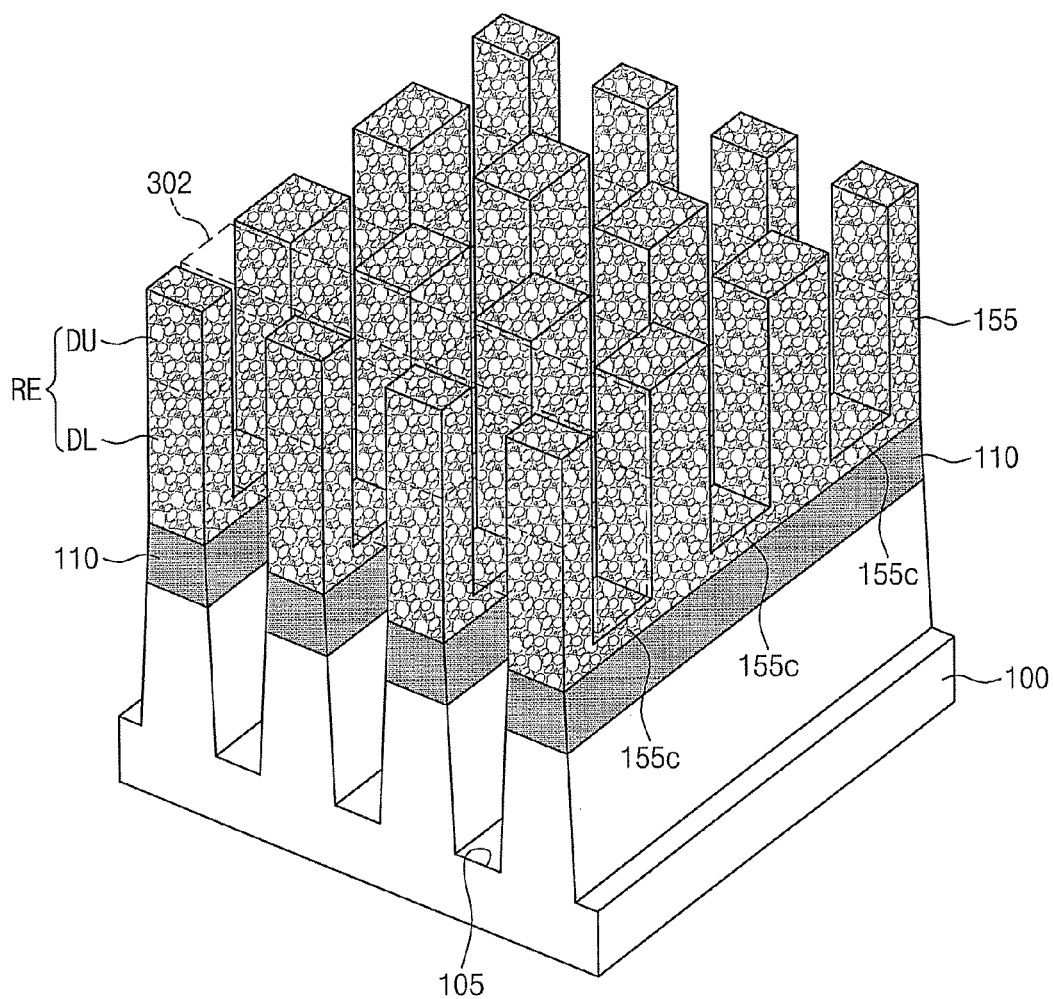
Figure 29:
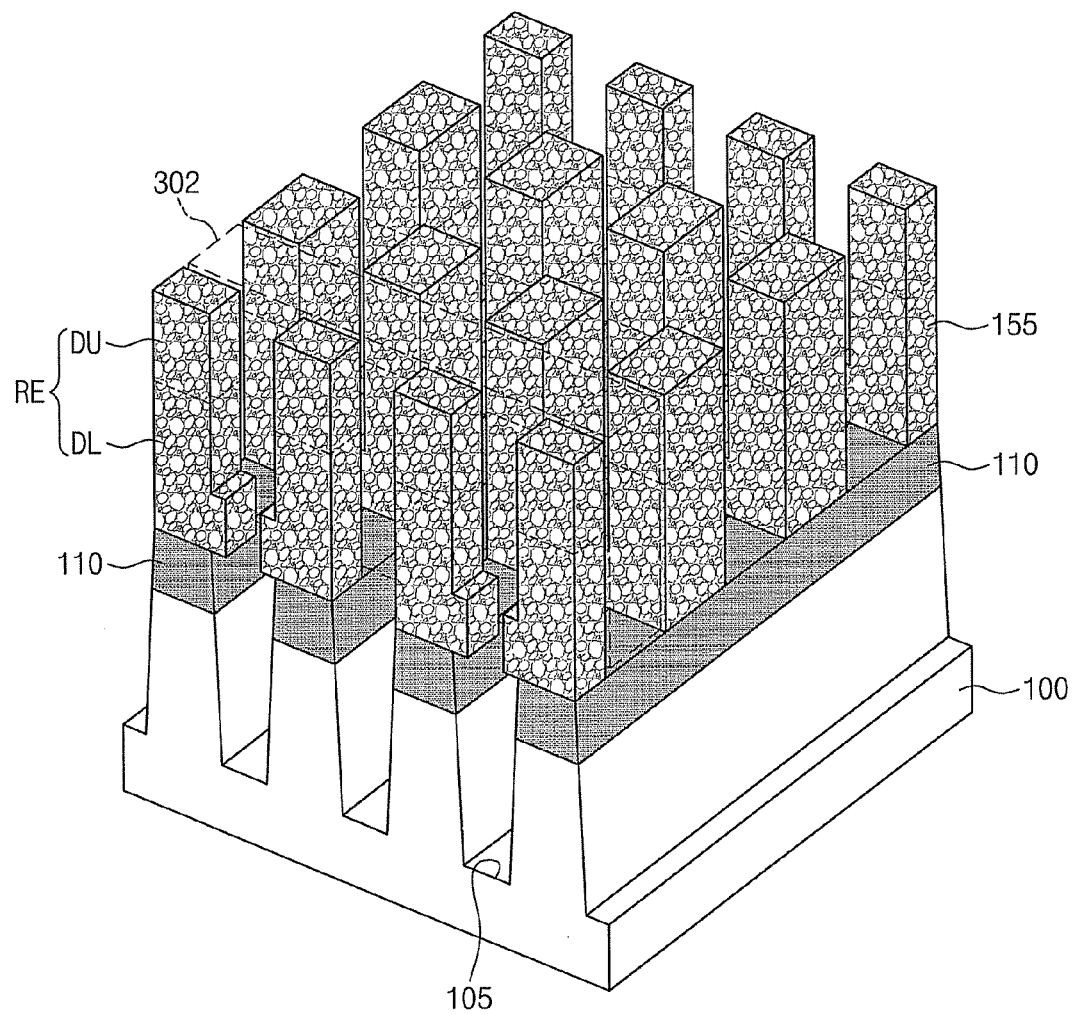

The second trenches 302 may be formed to expose the top surfaces of the active regions. For example, a bottom surface of the second trench 302 may be located at substantially the same level as the top surface of the substrate 100 (for example, as shown in FIGS. 26 and 29 discussed below) or a bottom surface of the second trench 302 may be located at a level lower than the top surface of the substrate 100 (for example, as shown in FIG. 27 discussed below). In example embodiments, the semiconductor patterns 155 may be spatially separated from each other by the first and second trenches 301 and 302 and arranged two-dimensionally on the substrate 100. In example embodiments, a bottom surface of the second trench 302 may be located at a level higher than the top surface of the substrate 100 (for example, as shown in FIG. 28 discussed below).

Figure 7:
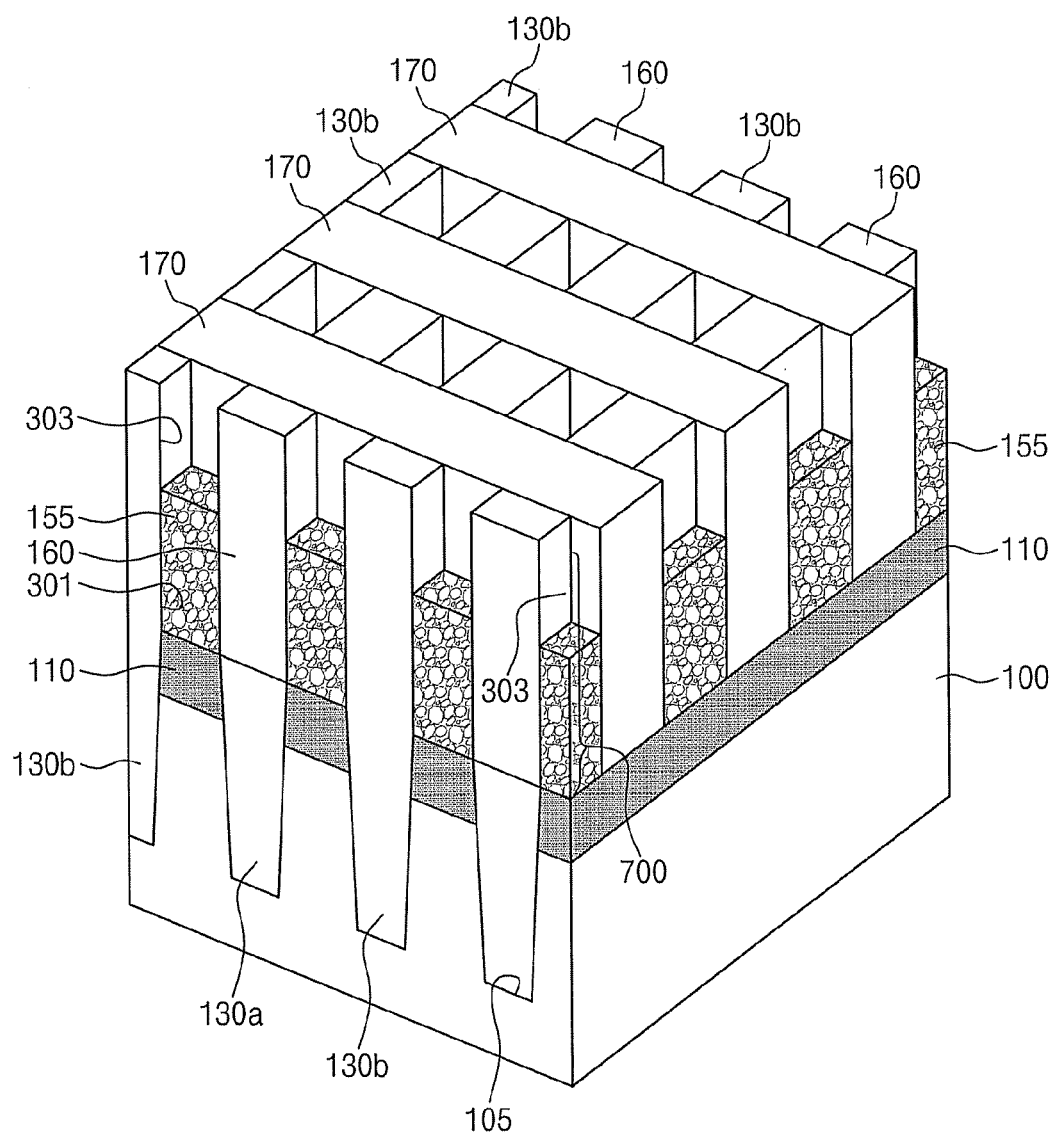

Referring to FIG. 7, second gap-fill patterns 170 may be formed to fill the second trenches 302, and recess regions 303 may be formed by etching top surfaces of the semiconductor patterns 155 to a desired or predetermined depth. Each of the recess regions 303 may have a pair of inner walls defined by the second gap-fill patterns 170 and another pair of inner walls defined by the first gap-fill patterns 160 and the device isolation patterns 130.

The formation of the second gap-fill patterns 170 may include forming a second gap-fill layer (not shown) filling the second trenches 302 and planarizing the second gap-fill layer until a top surface of the semiconductor pattern 155 is exposed. The second gap-fill patterns 170 may be formed of an insulating material. For example, the second gap-fill pattern 170 may include at least one of a silicon oxide layer or a low-k dielectric layer.

As shown in FIG. 7, each of the remaining semiconductor patterns 155 and each of the corresponding recess regions 303 define a space 700 in which one or more elements discussed below may be formed.

According to example embodiments of inventive concepts, a thermal treatment may be further performed after the formation of the semiconductor layer 150. The active region may serve as a seed layer for recrystallization of the semiconductor layer 150 during the thermal treatment. Thus, the semiconductor layer 150 after the thermal treatment may have a larger grain size than after the deposition thereof or before the thermal treatment. For example, a crystalline structure of the semiconductor layer 150 may be an amorphous structure immediately after the deposition of the semiconductor layer 150, but it may be deformed into a poly-crystalline or mono-crystalline structure after the thermal treatment. The thermal treatment may be preceded by one of steps described with reference to FIGS. 3 through 7.

The thermal treatment may be performed in various ways. For example, the thermal treatment may be performed in a temperature range of about 500° C. to about 700° C. or using a laser annealing method. In addition, the thermal treatment may be performed in a nitrogen atmosphere or an oxygen/hydrogen atmosphere. During the thermal treatment, impurities of the doped region 110 may be diffused into the semiconductor layer 150, the semiconductor spacer 152, or the semiconductor pattern 155 disposed thereon. Accordingly, lower regions of the semiconductor patterns 155 may be doped with impurities of the same conductivity type as the doped region 110.

Referring back to FIG. 7, an upper region of the semiconductor pattern 155 may be doped to have a conductivity type different from the doped region 110. This may be performed using an ion implantation technique. Accordingly, each of the semiconductor patterns 155 may be a doped semiconductor pattern acting as a switching device and may include an upper region and a lower region having different conductivity types. That is, a PN or PIN junction serving as a rectifying element may be formed in each of the semiconductor patterns 155.

As shown in FIG. 7, each of the rectifying elements (for example, a diode) is in the corresponding space 700, but not in the corresponding recess 303.

Figure 8:
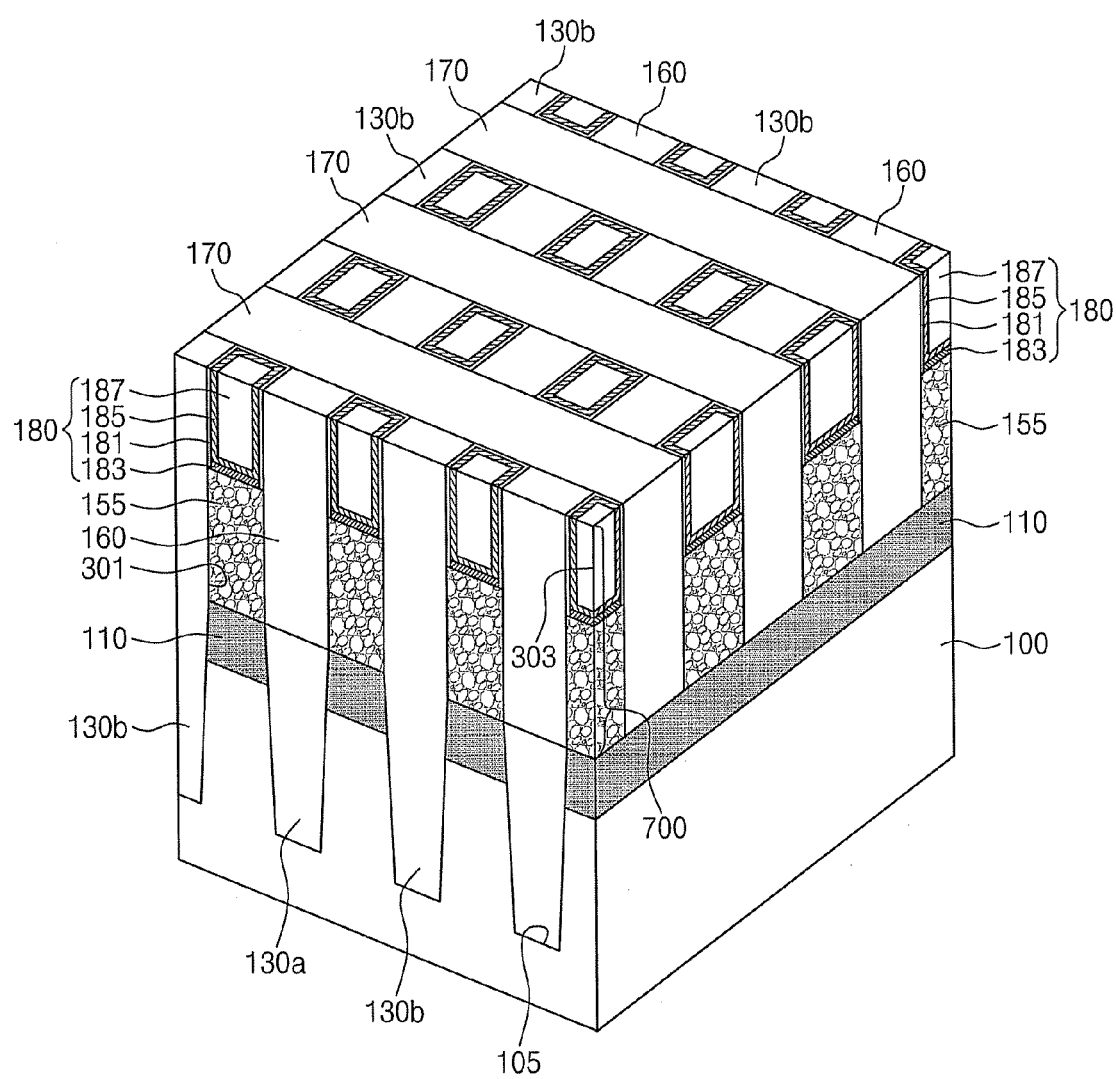

Referring to FIG. 8, electrode structures 180 may be formed on the semiconductor patterns 155. According to example embodiments, each of the electrode structures 180 may be formed within a corresponding one of the recess regions 303.

The electrode structure 180 may include an electrode pattern 185 having a top area smaller than a bottom area thereof. For example, the forming of the electrode patterns 185 may include forming an electrode layer (not shown) to conformally cover inner walls of the recess regions 303, and planarizing the electrode layer to expose a top surface of the second gap-fill pattern 170. The electrode layer may be formed using one of an ALD, an MO-CVD, a thermal CVD, a biased CVD, a plasma CVD, or an electron cyclotron resonance chemical vapor deposition (ECR CVD), and a thickness thereof may be in a range of about 0.1 nm to about 30 nm. Furthermore, the electrode layer or the electrode pattern 185 may be formed of at least one selected from nitrides including metallic elements, oxynitrides including metallic elements, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW), and tungsten silicide (WSix). Nitrides including metallic elements may include TiN, TaN, WN, MoN, NbN, TiSiN, TiAlN, TiBN, ZrSiN, WSiN, WBN, ZrAlN, MoSiN, MoAlN, TaSiN, and TaAlN, and the oxynitrides including metallic elements may include TiON, TiAlON, WON, and TaON.

The electrode structure 180 may further include at least one of an insulating spacer 181 and a recess gap-fill pattern 187. The insulating spacer 181 may be formed on an inner wall of the recess region 303 to expose a top surface of the semiconductor pattern 155. The recess gap-fill pattern 187 may be formed to fill the recess region 303 provided with the electrode pattern 185.

The forming of the insulating spacer 181 may be followed by the forming of the electrode layer or the electrode pattern 185. For example, the forming of the insulating spacer 181 may include forming a first insulating layer to conformally cover the recess region 303, and etching anisotropically the first insulating layer to expose a bottom surface of the recess region 303 again. The forming of the recess gap-fill pattern 187 may be preceded by the forming of the electrode layer or the electrode pattern 185. For example, it may include forming a second insulating layer to fill the recess region 303 provided with the electrode layer or the electrode pattern 185, and etching the second insulating layer during the planarization of the electrode layer or the electrode pattern 185.

According to example embodiments, the electrode structure 180, as shown in FIG. 8, may further include an ohmic layer 183 between the electrode pattern 185 and the semiconductor pattern 155. The ohmic layer 183 may be formed of, for example, metal silicides, which may be formed from a reaction between an exposed top surface of the semiconductor pattern 155 and a metallic material.

As shown in FIG. 8, each of the electrode structures 180 (for example, a bottom electrode) is in the corresponding space 700, and also in the corresponding recess 303.

Referring to FIGS. 9 and 10, memory elements 200 and upper interconnection lines 210 may be formed on the electrode structures 180. The upper interconnection lines 210 may be formed to cross over the active regions or the device isolation trenches 105.

According to example embodiments, as shown in FIG. 9, before forming the memory elements 200, a top surface of the electrode structure 180 may be partially recessed by upper trenches 304. For example, the upper trench 304 may be formed to cross the second trench 302, but example embodiments of inventive concepts are not limited thereto. For example, the upper trench 304 may be formed to cross the device isolation trenches 105 or the active regions Subsequently, as shown in FIG. 10, upper gap-fill patterns 190 may be formed to fill the upper trenches 304, and interlayer insulating patterns 195 may be formed on the upper gap-fill pattern 190. The interlayer insulating patterns 195 may be formed to cross the first trench 301 or the upper gap-fill pattern 190 and to define openings exposing a top surface of the electrode structure 180. The memory elements 200 may be formed to fill the opening defined by the interlayer insulating patterns 195, and the forming of the memory elements 200 may be performed using a damascene process. According to example embodiments, the upper trenches 304 may be filled with the interlayer insulating patterns 195, without the upper gap-fill pattern 190.

As shown in FIG. 10, each of the memory elements 200 is not in the corresponding space 700, nor is each of the memory elements 200 in the corresponding recess 303. However, in other example embodiments, each of the memory elements 200 may be in the corresponding recess 303. In other example embodiments, each of the memory elements 200 may be in the corresponding space 700 and in the corresponding recess 303.

Also, as shown in FIG. 10, the device isolation patterns 130a and the upper gap-fill patterns 190 are aligned, as are the first gap-fill patterns 160 and the upper gap-fill patterns 190.

The memory element 200 may include at least one resistance changeable material. For example, the memory element 200 may include at least one material (e.g., chalcogenides) whose resistance may be changed using thermal energy generated by an electric current flowing through the memory element 200. The chalcogenides may be a material including at least one of antimony (Sb), tellurium (Te), or selenium (Se).

In example embodiments, the memory element 200 may include a chalcogenide formed of tellurium (Te) having about 20 to about 80 atomic percent concentration, antimony (Sb) having about 5 to about 50 atomic percent concentration, and germanium (Ge) having the remaining concentration. In addition, the chalcogenide for the memory element 200 may further include impurities of at least one of N, O, C, Bi, In, B, Sn, Si, Ti, Al, Ni, Fe, Dy, or La. In example embodiments, the memory element 200 may be formed of one of GeBiTe, InSb, GeSb, and GaSb. In example embodiments, the memory element 200 may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material film may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the memory element 200 may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the memory element 200 may is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the memory element 200 may be made of a transition metal oxide having multiple resistance states, as described above. For example, the memory element 200 may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The memory element 200 may be a chemical compound including one or more elements selected from the group consisting of S, Se, Te, As, Sb, Ge, Sn, In and Ag.

According to example embodiments, the memory element 200 may include a layered structure whose electric resistance may be changed using a spin-polarized current or a spin torque transfer mechanism. For example, the memory element 200 may be configured to have a magneto-resistance property and include at least one ferromagnetic material and/or at least one antiferromagnetic material. According to example embodiments, the memory element 200 may include at least one of perovskite compounds or transition metal oxides.

The upper interconnection lines 210 may be formed of at least one selected from nitrides including metallic elements, oxynitrides including metallic elements, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW), and tungsten silicide (WSix). The nitrides including metallic elements may include TiN, TaN, WN, MoN, NbN, TiSiN, TiAlN, TiBN, ZrSiN, WSiN, WBN, ZrAlN, MoSiN, MoAlN, TaSiN, and TaAlN, the oxynitrides including metallic elements may include TiON, TiAlON, WON, and TaON.

Figure 19:
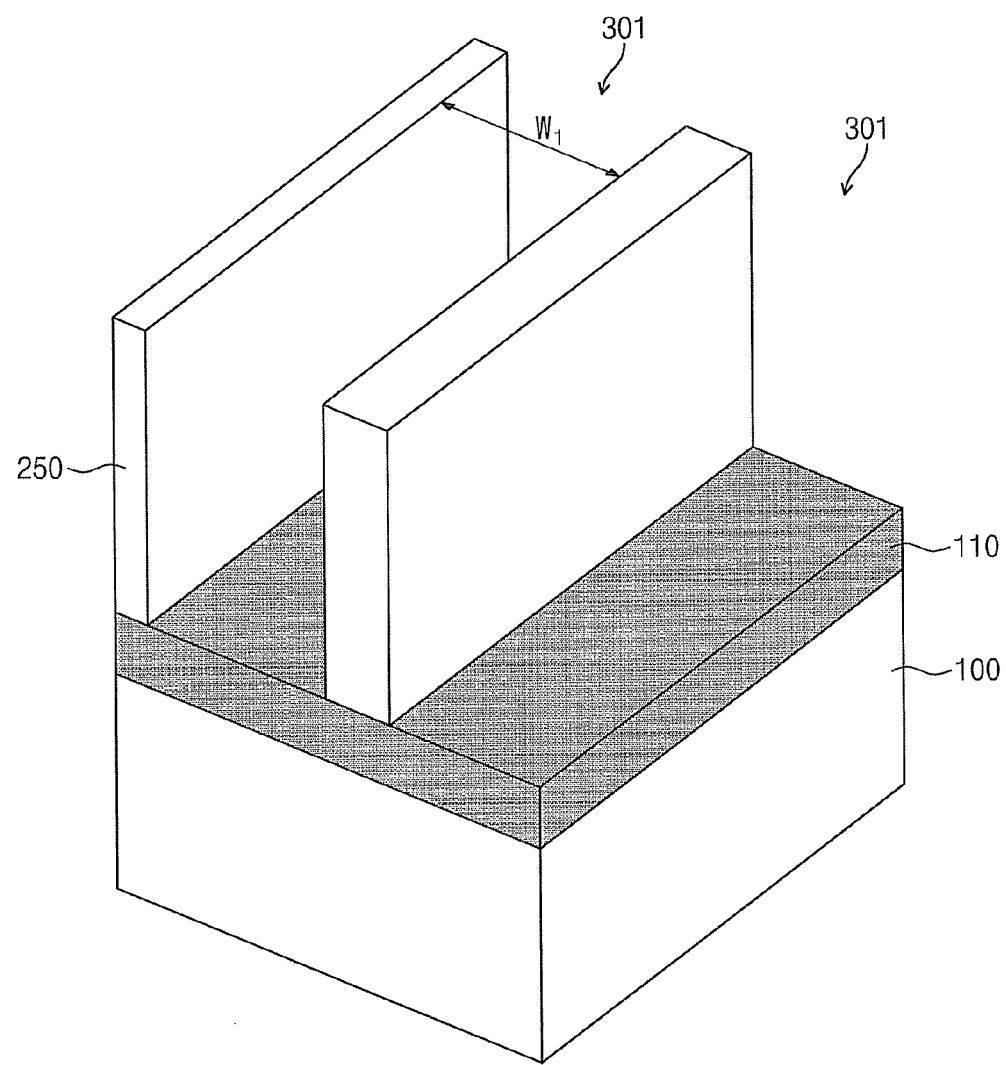

In contrast to example embodiments shown for example, in FIG. 1, according to other example embodiments of inventive concepts, as shown in FIGS. 11 and 19, the first trenches 301 may be defined by additional mold patterns 250, not by the device isolation patterns 130. For example, as shown in FIG. 11, the mold patterns 250 may be formed on the even-numbered device isolation patterns 130b after the removal of the device isolation masks 120. In example embodiments, a thickness of the device isolation pattern 130 may be almost the same as a depth of the device isolation trench 301, not as shown in FIG. 1. For example, a thickness of the device isolation pattern 130 may be 50 to 200% of the depth of the device isolation trench 301. As a result, as shown in FIG. 12, a height difference between top surfaces of the device isolation pattern 130 and the active region may decrease compared with example embodiments of FIG. 1.

FIGS. 12 through 18 are perspective views illustrating methods of fabricating semiconductor devices according to example embodiments of inventive concepts. For concise description, overlapping description of elements previously described with reference to FIGS. 1-11 may be omitted.

As described with reference to FIG. 3, the semiconductor layer 150 may be formed to cover an inner wall of the first trench 301. A capping layer may be formed on the semiconductor layer 150 and spacers 140 may be formed, from the capping layer, on a sidewall of the semiconductor layer 150. Subsequently, the semiconductor layer 150 may be anisotropically etched using the spacers 140 as an etch-mask. This etching may be performed to expose at least a top surface of the device isolation pattern 130a. As a result, as shown in FIG. 12, the semiconductor layer 150 may be spatially divided into two semiconductor spacers 152 in each of the first trenches 301. According to example embodiments, the capping layer and the spacers 140 are formed of at least one of SiO2, SiON, a metal oxide, or a metal oxynitride.

Figure 12:
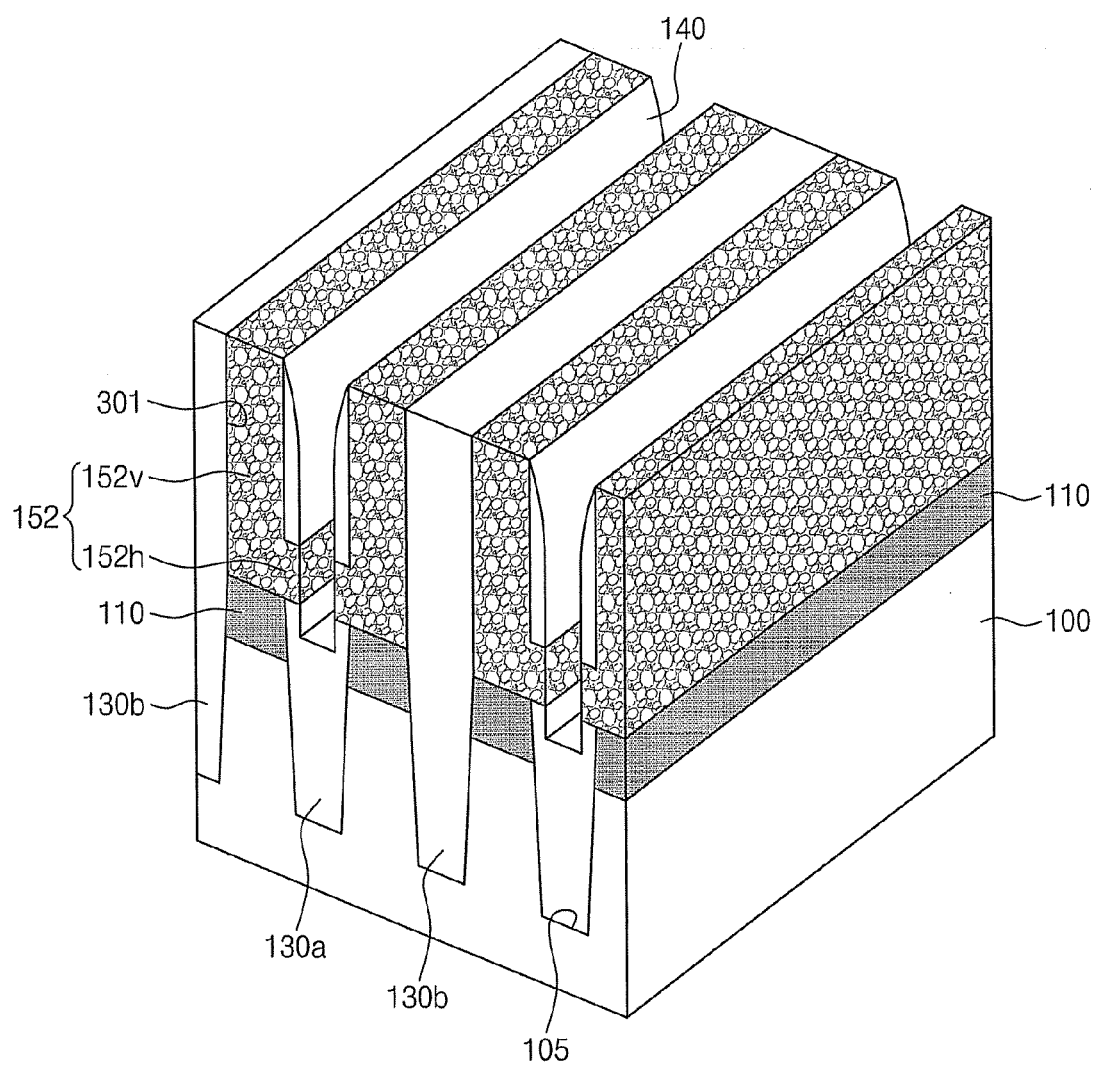

According to example embodiments, as shown in FIG. 12, a top surface of the odd-numbered device isolation pattern 130a may be recessed to below a top surface of the active region adjacent thereto. In addition, each of the semiconductor spacers 152 may include a vertical body portion 152v covering the inner sidewall of the first trench 301 and a horizontal extension 152h laterally extended to cover a top surface of the odd-numbered device isolation pattern 130a. The horizontal extension 152h may be interposed between the spacer 140 and the odd-numbered device isolation pattern 130a.

Figure 13:
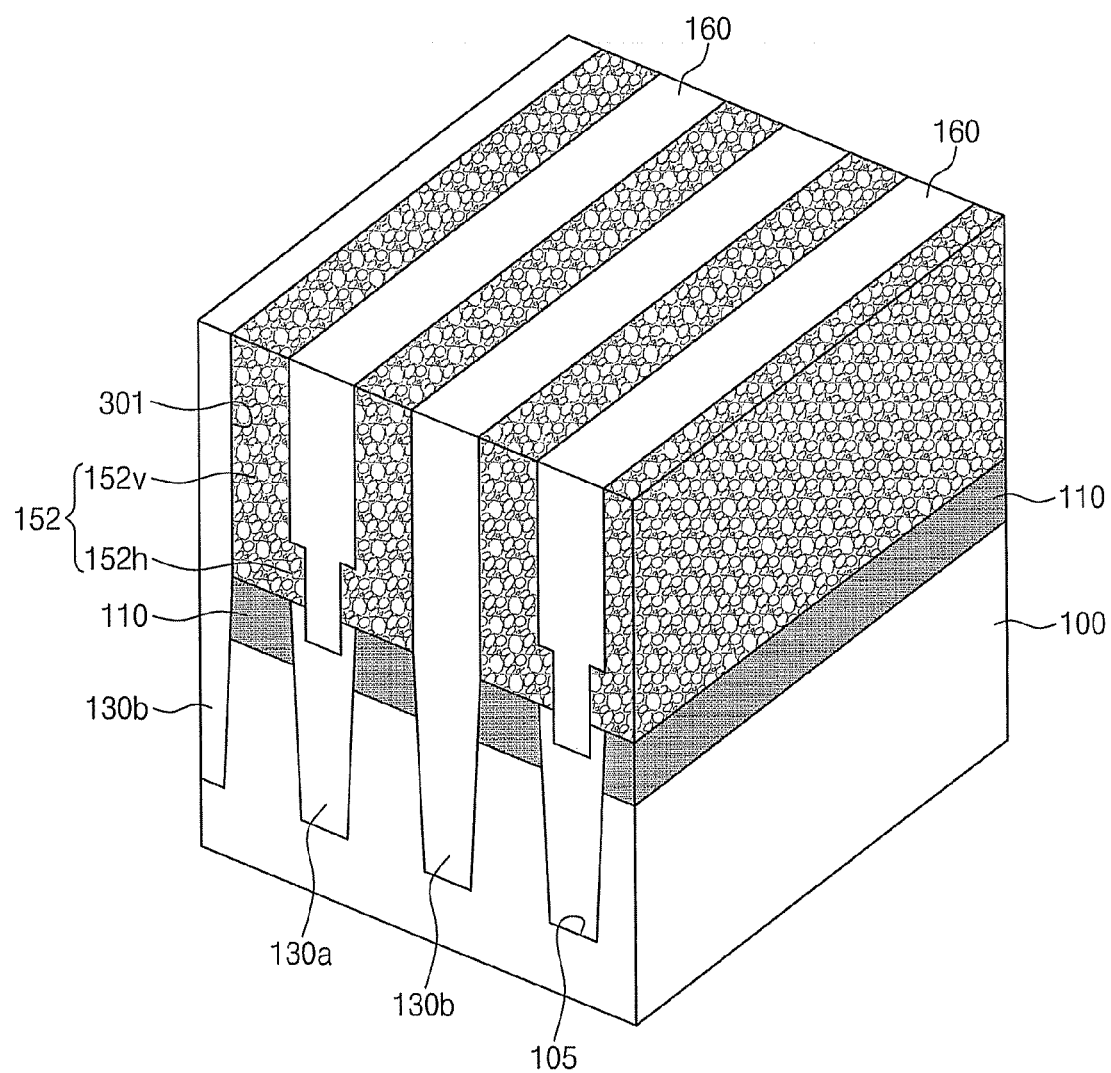

Subsequently, a first gap-fill pattern 160 may be formed to fill the first trench 301 provided with the spacers 140. This may be performed using the same fabricating methods as example embodiments described with reference to FIG. 5. According to example embodiments, as shown in FIG. 13, the spacers 140 may be removed before forming the first gap-fill pattern 160.

In example embodiments, the odd- and even-numbered device isolation patterns 130a, 130b act as lower device isolation patterns or field isolation patterns, whereas the first gap-fill patterns 160 act as upper device isolation patterns. In example embodiments, the field isolation patterns (for example, the odd-numbered device isolation patterns 130a) and the upper device isolation patterns (for example, the first gap-fill patterns 160) are aligned. In example embodiments, the field isolation patterns (for example, the even-numbered device isolation patterns 130b) and the upper device isolation patterns (for example, the even-numbered device isolation patterns 130b) are a single unit or body.

Figure 14:
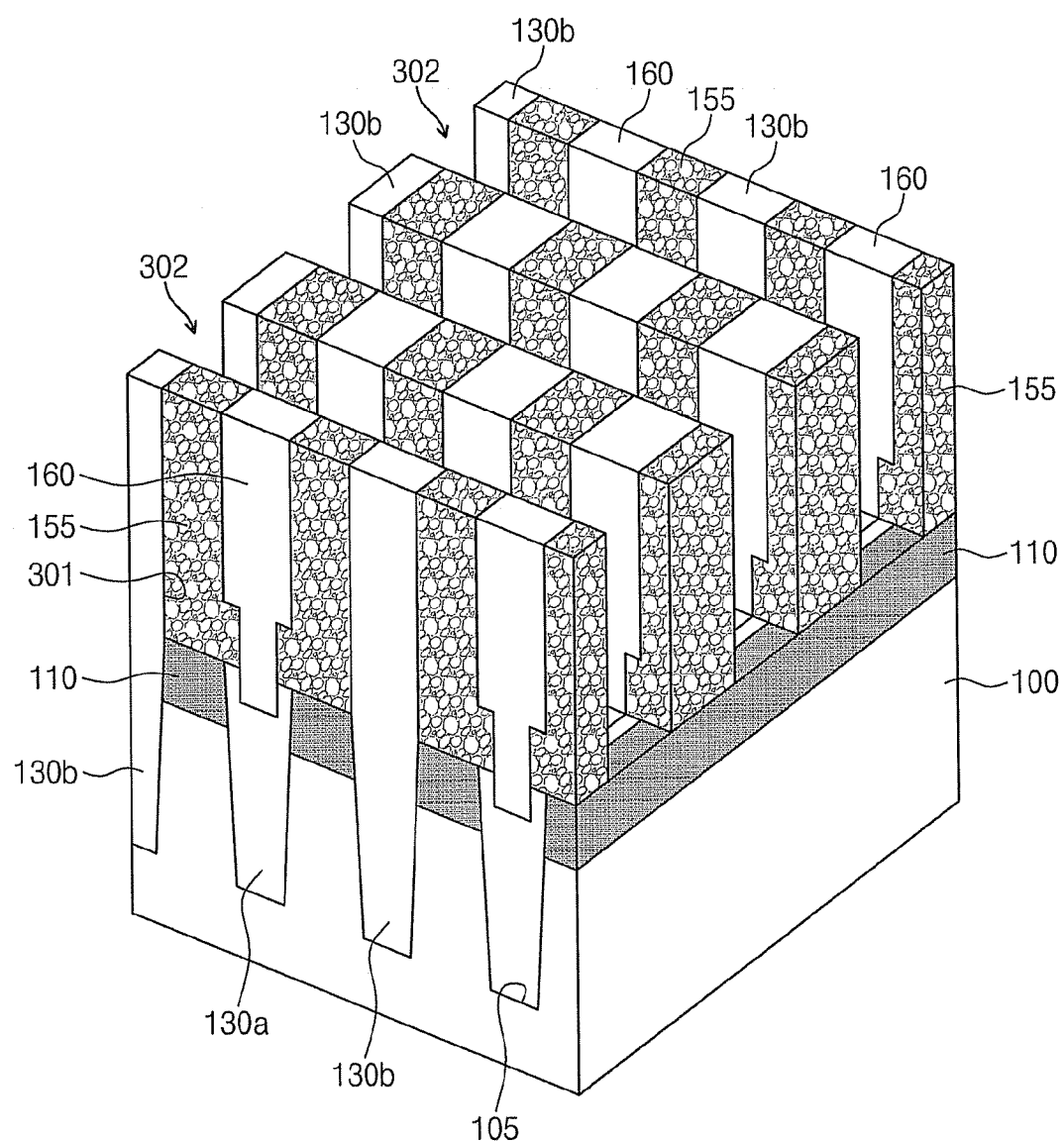
Figure 15:
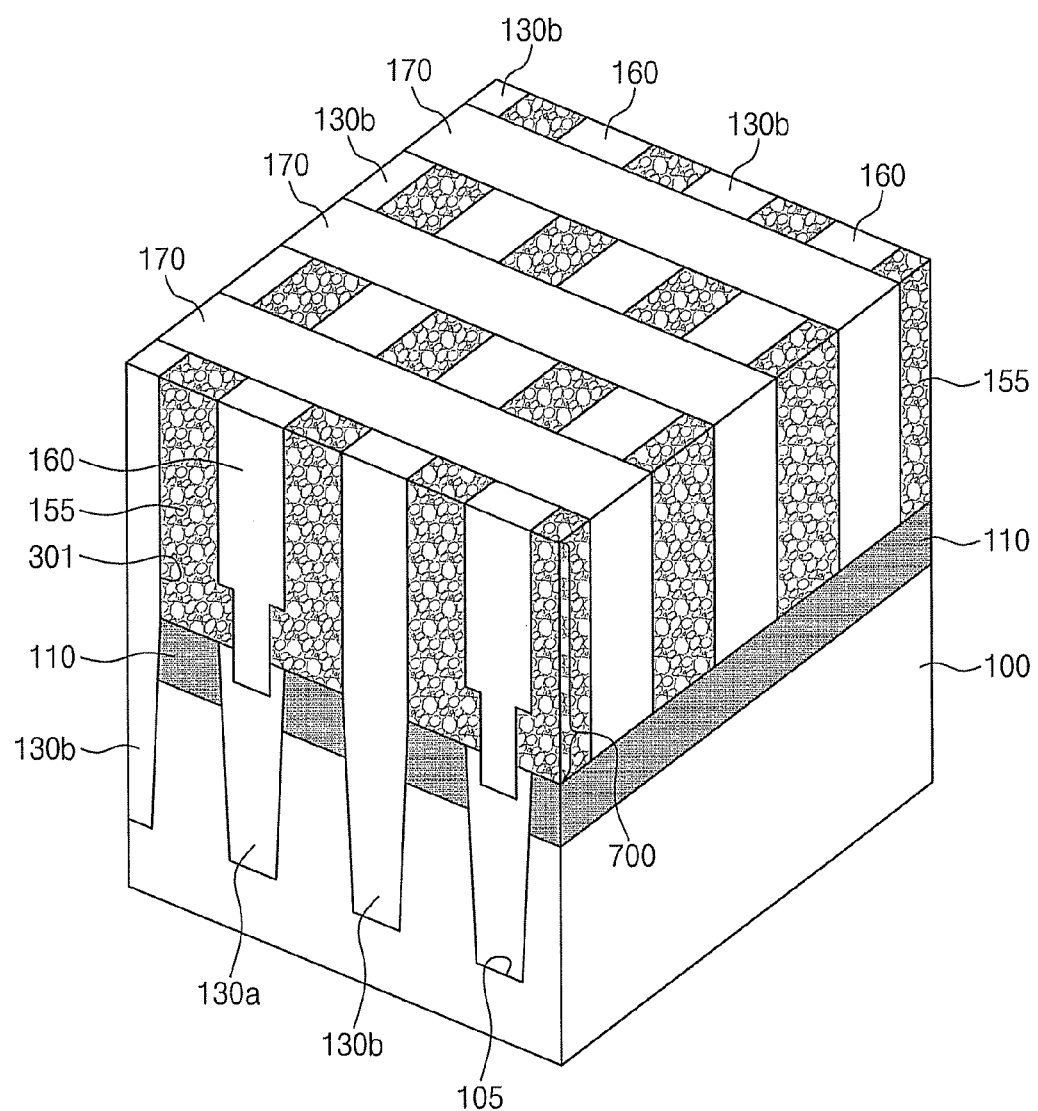

Thereafter, as shown in FIG. 14, second trenches 302 may be formed to cross over the first trenches 301, and next, as shown in FIG. 15, second gap-fill patterns 170 may be formed to fill the second trenches 302. The formation of the second trenches 302 and the second gap-fill patterns 170 may be performed using the same fabricating methods as the example embodiments described with reference to FIGS. 6 and 7. According to example embodiments, the formation of the recess regions 303 as shown in FIG. 7 may be omitted.

Figure 16:
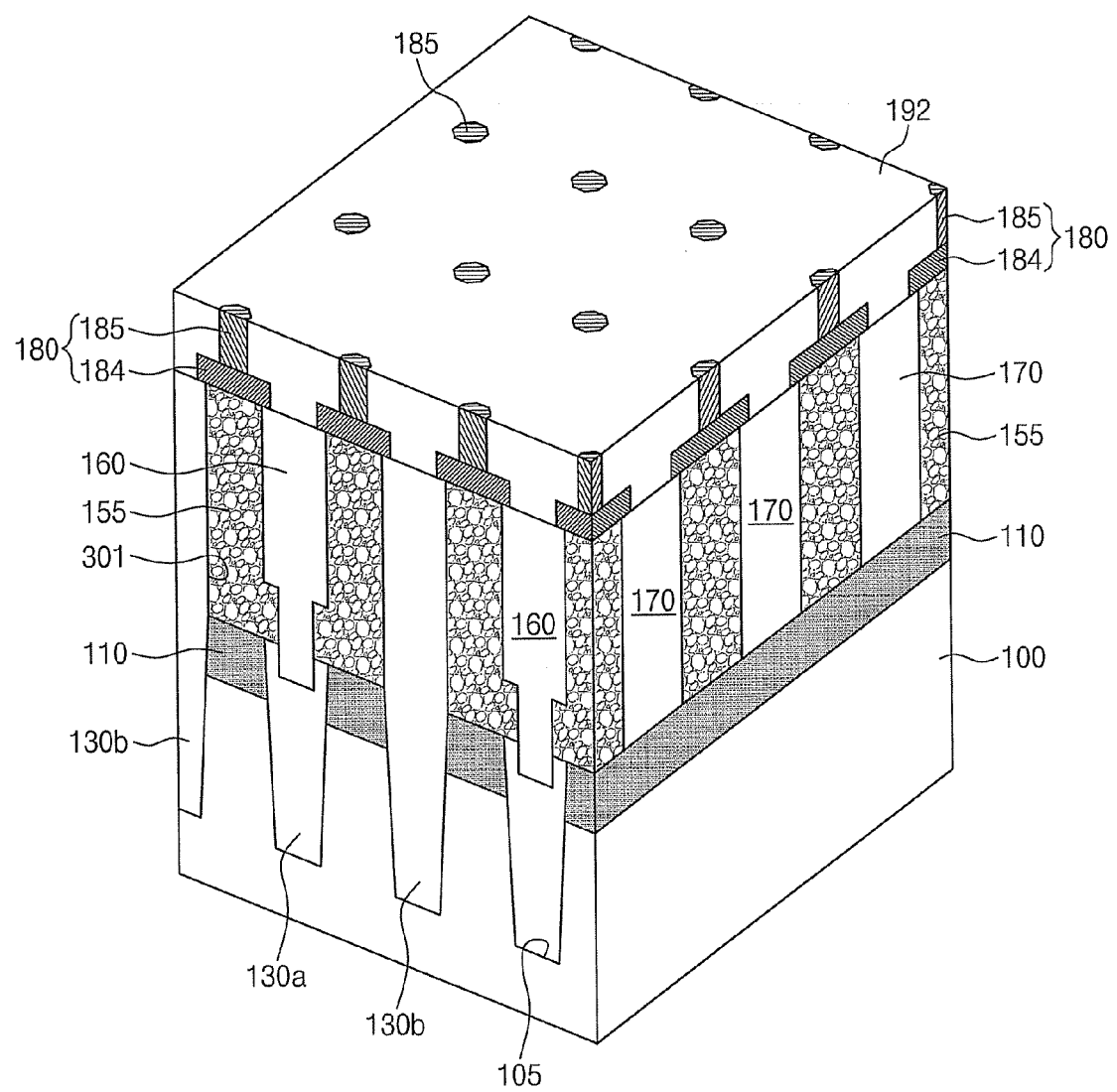
Figure 18:
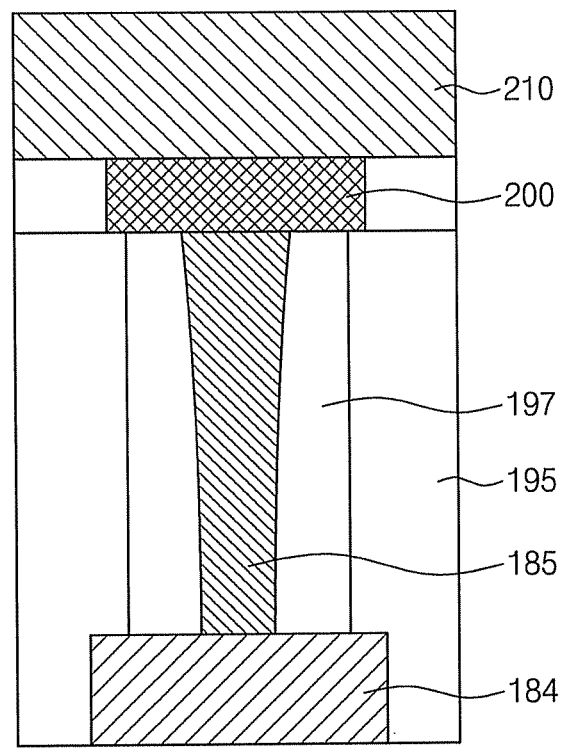

Referring to FIG. 16, an interlayer dielectric layer 192 may be formed on the resultant structure provided with the second gap-fill patterns 170, and electrode structures 180 may be formed to penetrate the interlayer dielectric layer 192 and to be connected to each of the semiconductor patterns 155. Each of the electrode structures 180 may include a pad pattern 184 covering a top surface of the semiconductor pattern 155 and an electrode pattern 185 formed on the pad pattern 184. According to example embodiments, as shown in FIG. 16, the electrode pattern 185 may have a pillar shape As shown in FIG. 18, an upper spacer 197 may be further formed between the electrode pattern 185 and the interlayer dielectric layer 192. Due to the upper spacer 197, a width of the electrode pattern 185 may be smaller than the minimum feature size of a pattern, which may be realized using a lithography process.

Figure 17:
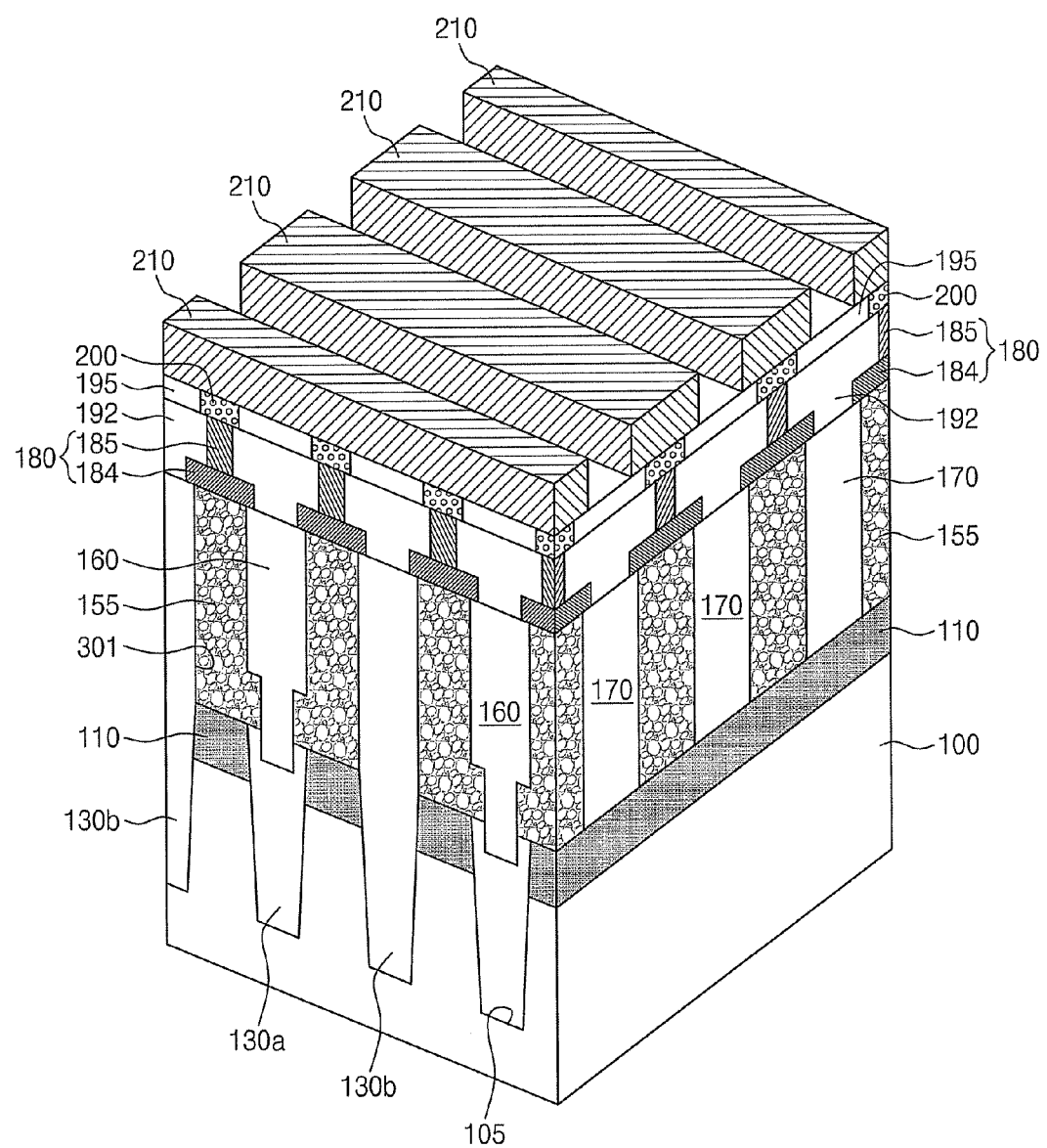

Subsequently, memory elements 200 and upper interconnection lines 210 may be formed on the electrode structures 180. This may be performed using the same fabricating methods as the example embodiments described with reference to FIG. 10. In example embodiments, as shown in FIG. 17, each of the memory elements 200 may be connected to one of the electrode structures 180. As a result, the memory elements 200 may be two-dimensionally arranged, and each of the upper interconnection lines 210 may electrically connect the memory elements 200 disposed along a direction crossing the active regions.

As shown in FIG. 17, each of the rectifying elements (for example, a diode) is in a space 700, corresponding to the semiconductor pattern 155, each of the electrode structures 180 (for example, a bottom electrode) is not in the corresponding space 700, and each of the memory elements 200 is not in the corresponding space 700.

Also, as shown in FIG. 17, the device isolation patterns 130a, the first gap-fill pattern 160, and the interlayer dielectric layer 192 are aligned, as are the second gap-fill patterns 170 and the interlayer dielectric layer 192.

In contrast to example embodiments shown for example, in FIG. 1, according to other example embodiments of inventive concepts, as shown in FIG. 19, the first trenches 301 may be defined by additional mold patterns 250, not by the device isolation patterns 130.

FIGS. 19 through 25 are perspective views illustrating methods of fabricating semiconductor devices according to example embodiments of inventive concepts. For concise description, overlapping description of elements previously described with reference to FIGS. 1-18 may be omitted.

As shown in FIG. 19, mold patterns 250 may be formed on the substrate 100 to define the first trenches 301. The mold patterns 250 may include at least one of insulating materials. It may be understood that the mold patterns 250 in example embodiments may correspond to the even-numbered device isolation patterns 130b of the previously described embodiments, in that they define the first trenches 301.

Before forming the mold patterns 250, a doped region 110 may be formed in an upper region of the substrate 100. The doped region 110 may be formed to have a conductivity type different from that of the substrate 100, as in example embodiments described with reference to FIG. 1.

Figure 20:
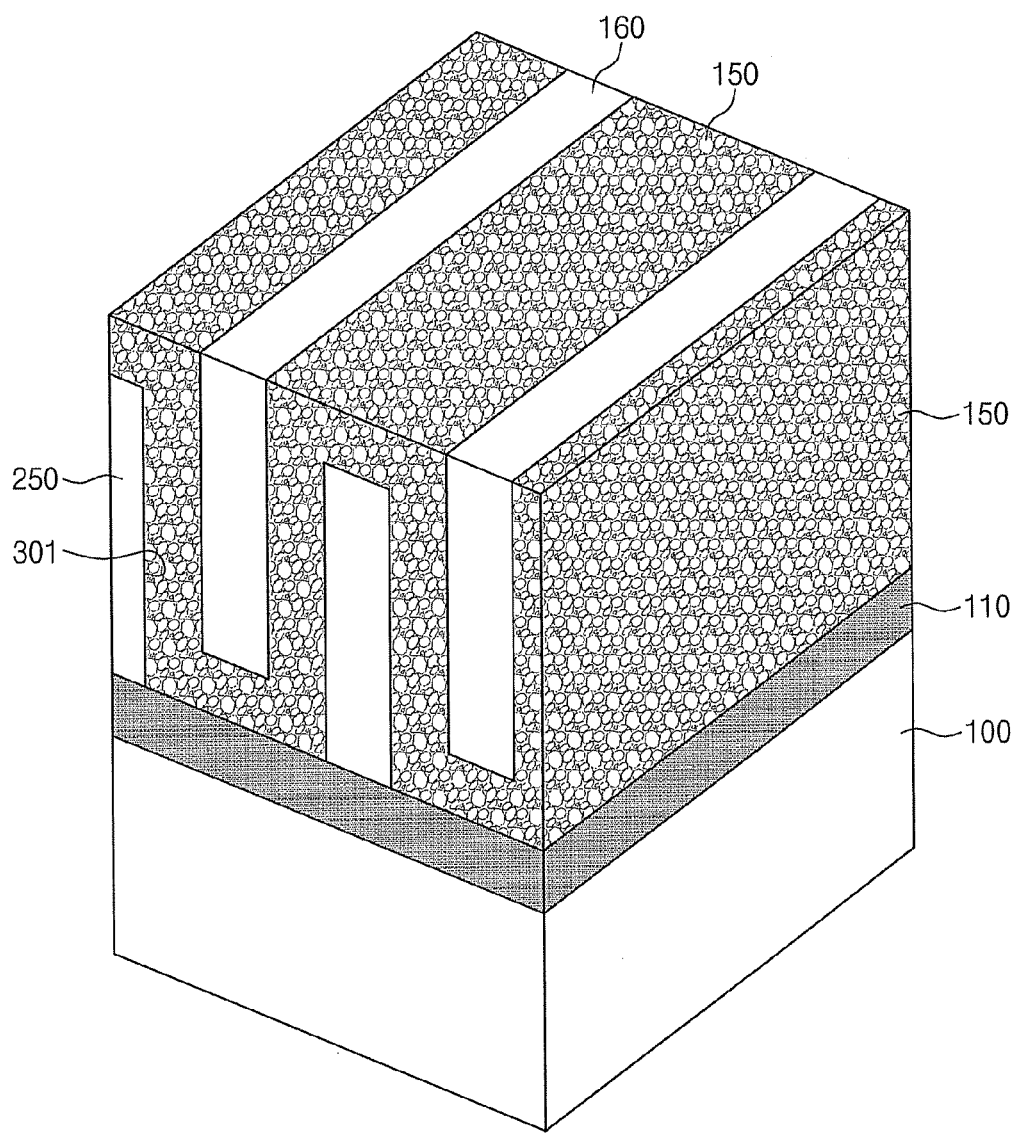

Subsequently, as shown in FIG. 20, a semiconductor layer 150 may be formed to conformally cover a resultant structure provided with the mold patterns 250, and first gap-fill patterns 160 may be formed to fill the first trench 301 provided with the semiconductor layer 150.

Figure 21:
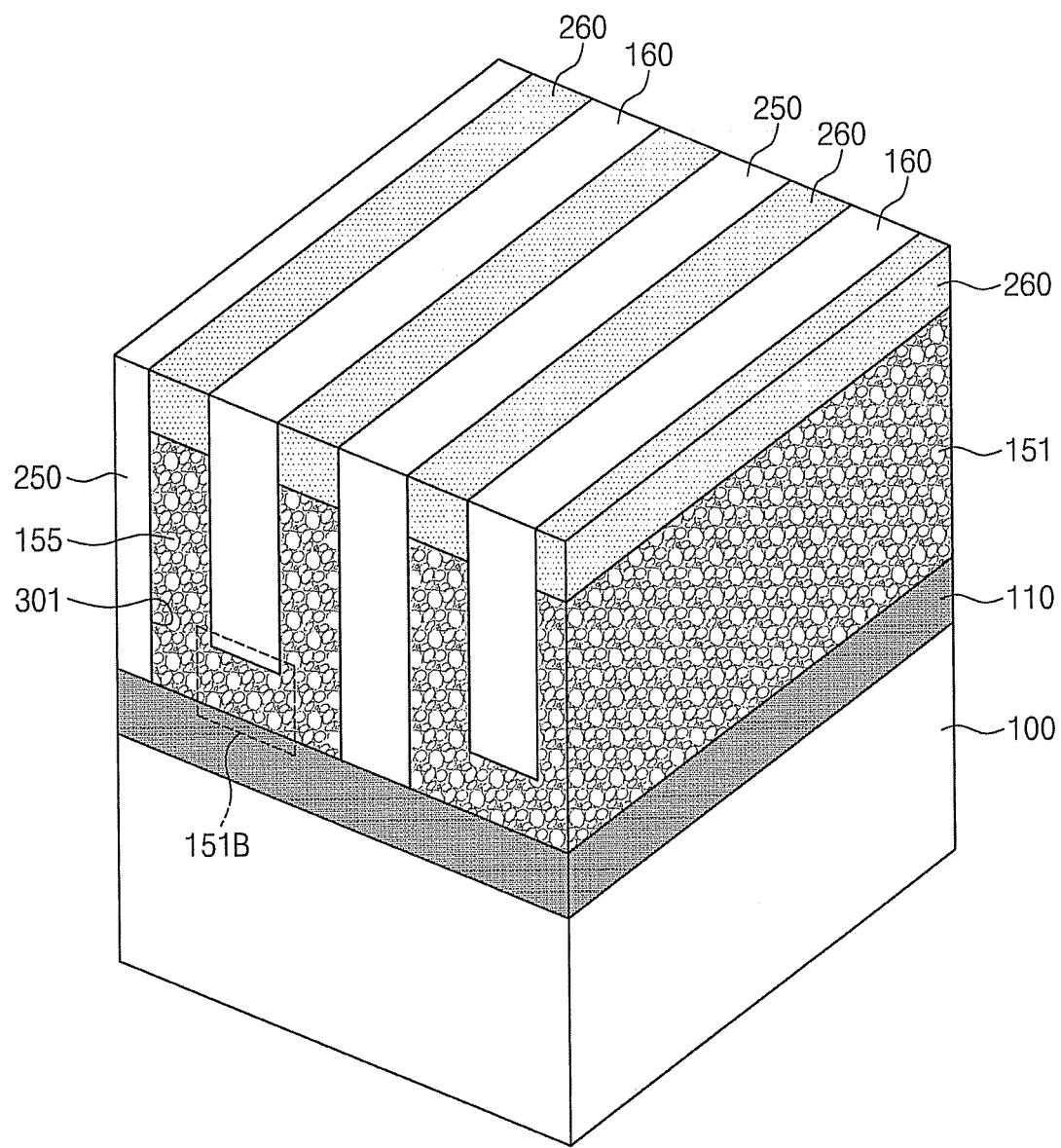

The resultant structure having the semiconductor layer 150 may be planarized by etching until top surfaces of the mold patterns 250 are exposed. As a result, the semiconductor layer 150 may be horizontally separated by the mold patterns 250, thereby being localized in each of the first trenches 301 as shown in FIG. 21. Thereafter, a top surface of the localized semiconductor layer 151 may be selectively etched to be at a lower level than the top surfaces of the mold patterns 250. Accordingly, a gap region defined by the recessed top surface of the localized semiconductor layer 151 may be provided between the mold pattern 250 and the first gap-fill pattern 160. Next, as shown in FIG. 21, capping patterns 260 may be formed to fill the gap region provided between the mold pattern 250 and the first gap-fill pattern 160.

Figure 22:
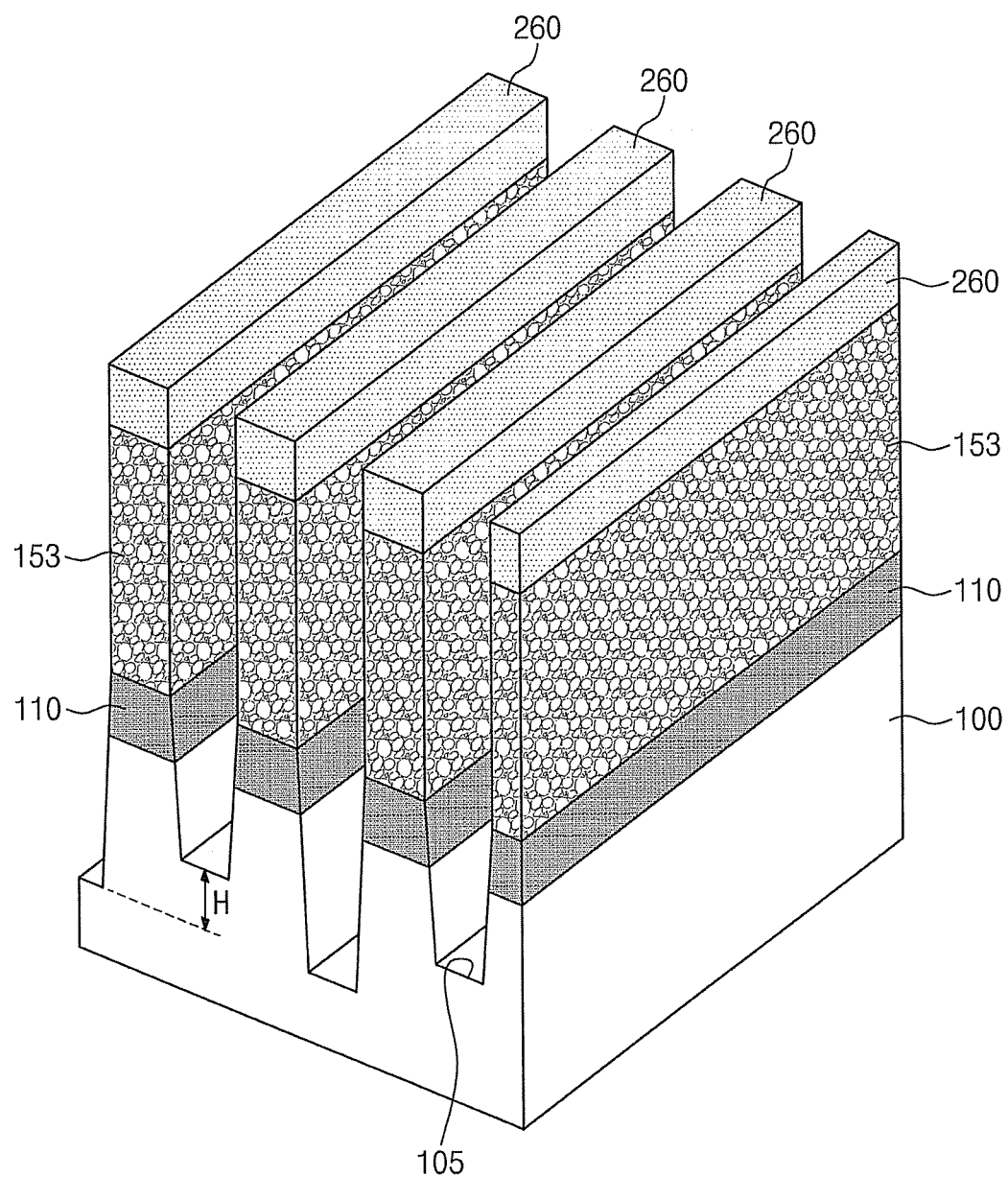

The mold patterns 250 and the first gap-fill patterns 160 may be removed, and the localized semiconductor layer 151 and the substrate 100 may be anisotropically etched using the capping patterns 260 as an etch mask. As a result, as shown in FIG. 22, semiconductor lines 153 (also referred to as diode patterns) may be formed under the respective capping patterns 260, and active regions cut by device isolation trenches 105 may be formed under the respective semiconductor lines 153. A minimum depth of the device isolation trenches 105 may be greater than a thickness of the doped region 110. Thus, the doped regions 110 may be spatially divided by the device isolation trenches 105.

The localized semiconductor layer 151 may include a bottom portion 151B disposed under the first gap-fill pattern 160 as shown in FIG. 21. Thus, there may be a height difference (H) between bottom surfaces of the device isolation trenches 105, as shown in FIG. 22.

Figure 23:
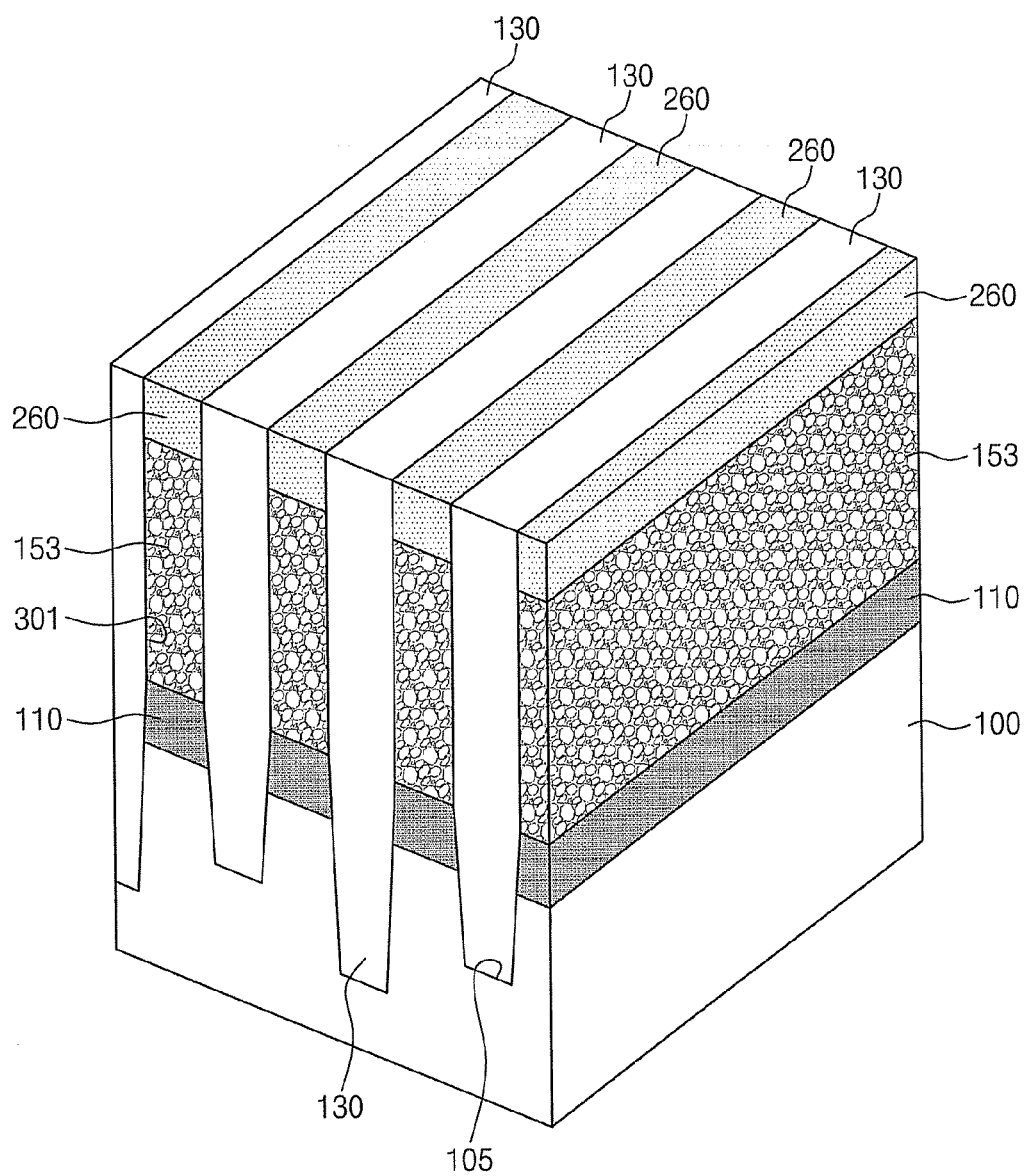
Figure 24:
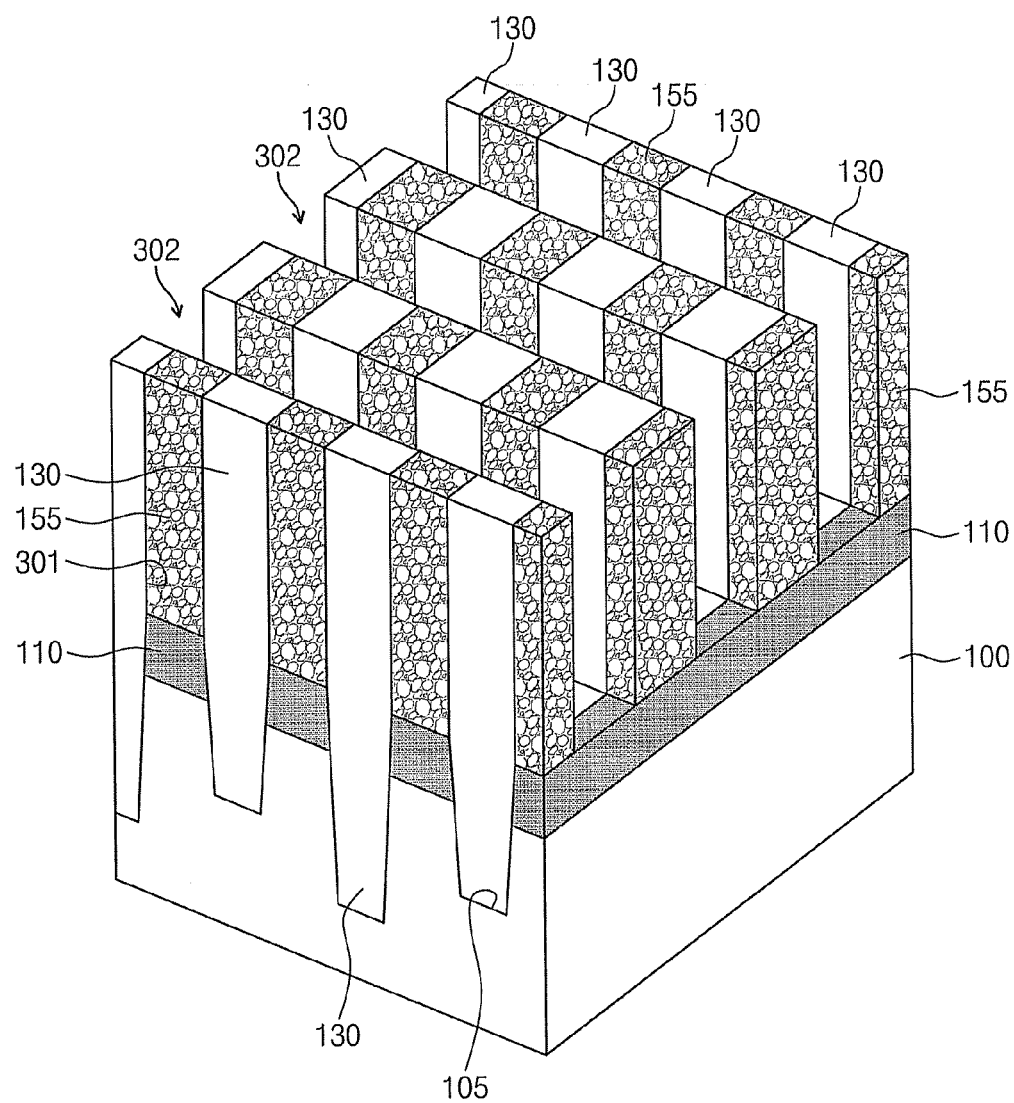

Thereafter, as shown in FIG. 23, device isolation patterns 130 may be formed to fill the device isolation trenches 105, and as shown in FIG. 24, second trenches 302 may be formed to run across the device isolation trenches 105. The semiconductor lines 153 may be cut by the second trenches 302, thereby forming semiconductor patterns 155 arranged two-dimensionally.

In example embodiments, the device isolation patterns 130 act as lower device isolation patterns or field isolation patterns and upper device isolation patterns. In example embodiments, the field isolation patterns and the upper device isolation patterns (for example, the device isolation patterns 130) are a single unit or body.

Figure 25:
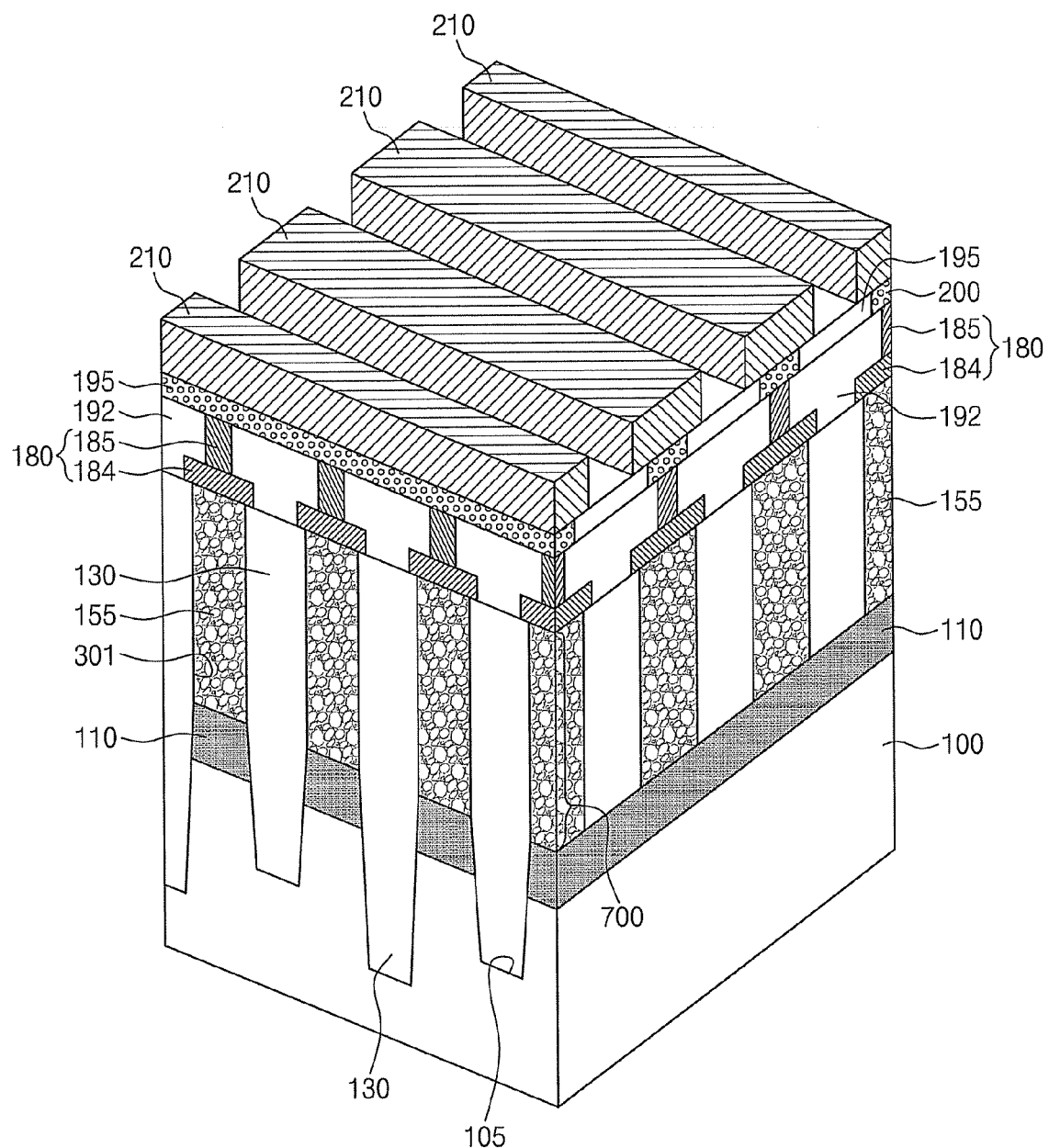

Next, as shown in FIG. 25, electrode structures 180 may be formed on the respective semiconductor patterns 155, and memory elements 200 and upper interconnection lines 210 may be sequentially formed on the electrode structures 180. These processes will be easily realized by the aforementioned example embodiments or their modifications, and therefore, a description thereof will be omitted.

As shown in FIG. 25, each of the rectifying elements (for example, a diode) is in a space 700, corresponding to the semiconductor pattern 155, each of the electrode structures 180 (for example, a bottom electrode) is not in the corresponding space 700, and each of the memory elements 200 is not in the corresponding space 700.

FIGS. 26 through 32 are partial perspective views illustrating semiconductor devices according to example embodiments of inventive concepts. In order to reduce complexity in the drawings and to provide better understanding of example embodiments of inventive concepts, some elements of semiconductor devices may be omitted. For example, some of insulating elements, which are not used as paths of electrical current, are omitted from FIGS. 26 through 32. Additionally, for concise description, description of overlapping elements previously described may be omitted. Because semiconductor devices described herein may be fabricated through modifications of the above-mentioned fabricating methods and other different fabricating methods, all the described elements of disclosed fabricating method may not necessarily be explicitly included in description of semiconductor devices.

Referring to FIGS. 26 through 29, semiconductor devices may include a substrate 100 and rectifying elements RE arranged two-dimensionally on the substrate 100. Each of the rectifying elements RE may serve as a selection device controlling a flow of an electric current flowing through the memory element 200.

For example, the substrate 100 may include active regions defined by device isolation trenches 105. Line-shaped doped regions 110 may be formed in upper regions of the active regions, where the line-shaped doped regions 110 may have a different conductivity type from the substrate 100. The line-shaped doped regions 110 may be formed to include impurities of high concentration such that they can serve as lower interconnection lines.

The rectifying elements RE may be realized in the semiconductor patterns 155, which may be formed using fabrication methods according to the aforementioned example embodiments. For example, the rectifying element RE may include an upper doped region DU and a lower doped region DL formed in the upper and lower regions of the semiconductor pattern 155, respectively, where the upper and lower doped regions DU and DL may be formed to have different conductivity types. For example, the lower doped region DL may have the same conductivity type as the line-shaped doped region 110, and the upper doped region DU may have a different conductivity type from the line-shaped doped region 110. Accordingly, the upper and lower doped regions DU and DL may form a PN junction capable of acting as a rectifying element.

According to example embodiments, an intrinsic region (not shown) may be formed between the upper and lower doped regions DU and DL, and thus each of the semiconductor patterns 155 may form a p-i-n junction.

According to example embodiments of inventive concepts, the lower doped region DL and the line-shaped doped region 110 may have a different conductivity type from the upper doped region DU and the substrate 100 and be disposed between the upper doped region DU and the substrate 100. Accordingly, the substrate 100 and the semiconductor pattern 155 may form a p-n-p or n-p-n bipolar transistor capable of serving as a rectifying element or a switching element.

According to example embodiments, as shown in FIGS. 26 and 27, the semiconductor patterns 155 may be separated from each other along both x and y directions and arranged two-dimensionally. However, according to example embodiments, as shown in FIG. 28, a connecting portion 155c may remain under the second trench 302. Due to the connecting portion 155c, the semiconductor patterns 155 may be connected with each other along a direction parallel to the device isolation trench 105. In example embodiments, a top surface of the connecting portion 155c may be lower than an interfacial surface between the upper and lower doped regions DU and DL (e.g., a junction interface in which concentrations of donor and acceptor are equal with each other).

According to example embodiments, each of the semiconductor patterns 155 may include a vertical body portion 155v disposed on the active region and a horizontal extension 155h extended laterally from a lower sidewall of the vertical body portion 155v. As described with reference to FIGS. 12 through 17, this structure of the semiconductor pattern 155 may be formed by using the spacer 140 disposed on a sidewall of the semiconductor layer 150 as an etch-mask.

Figure 30:
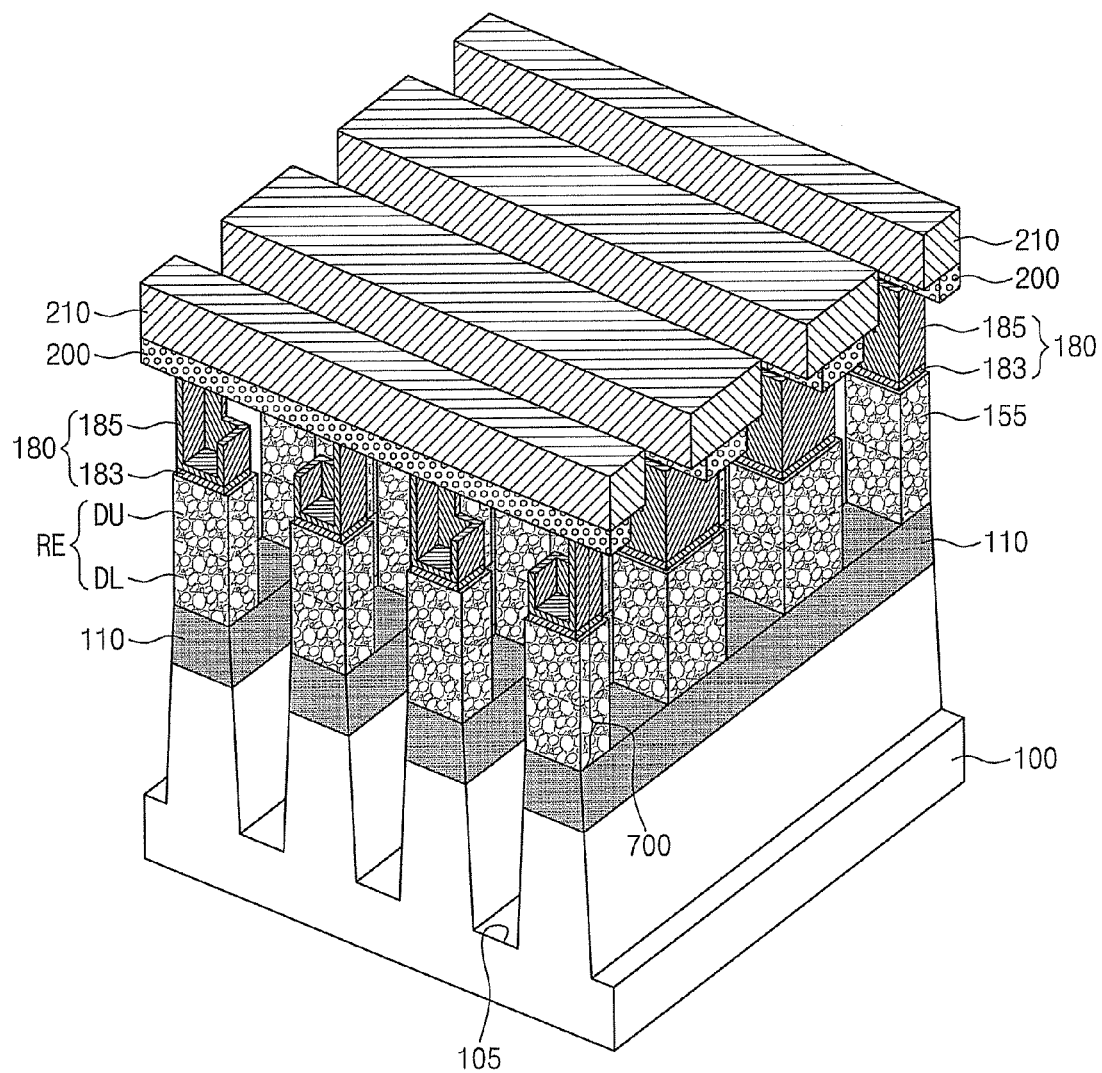
Figure 31:
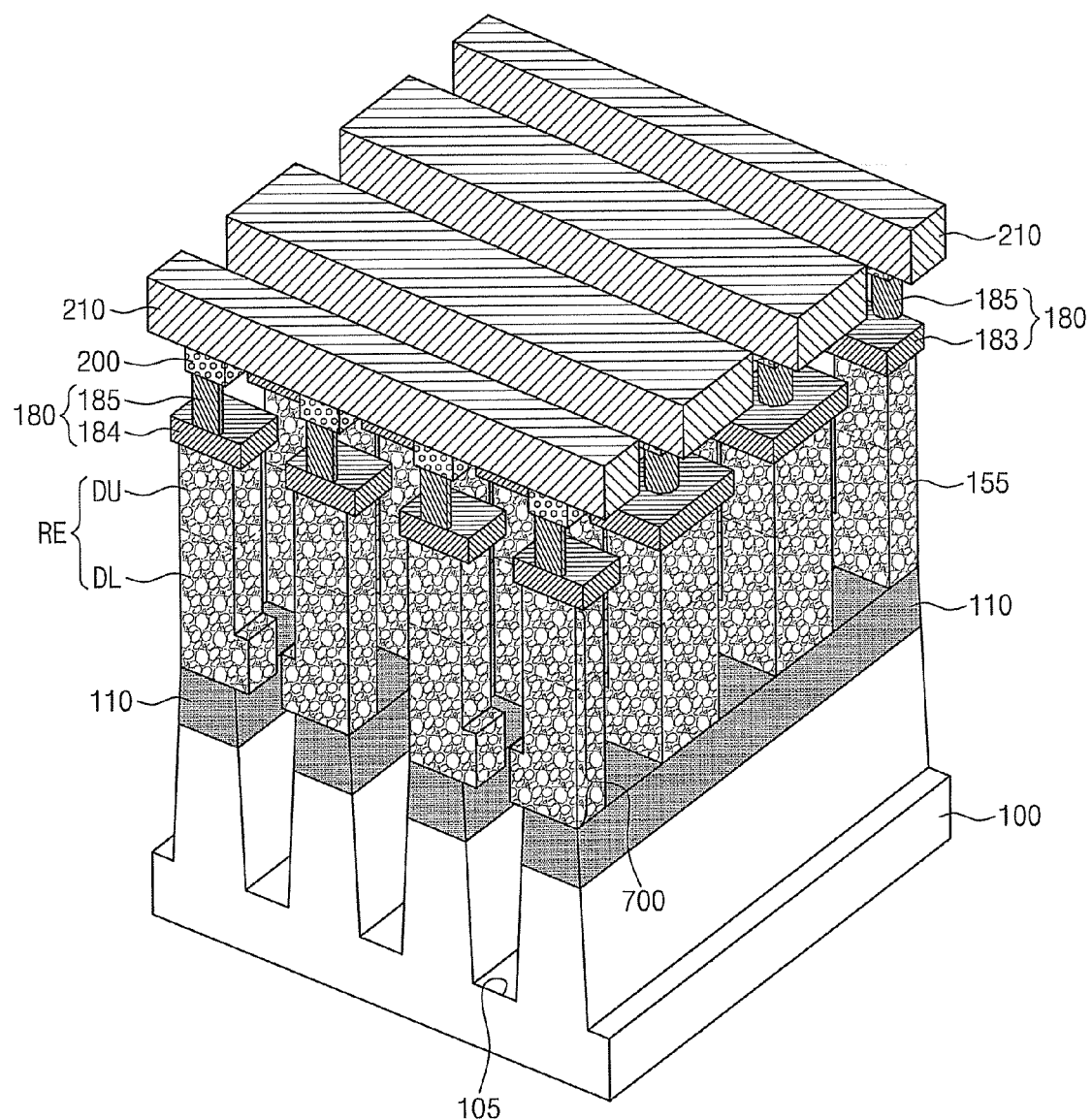
Figure 32:
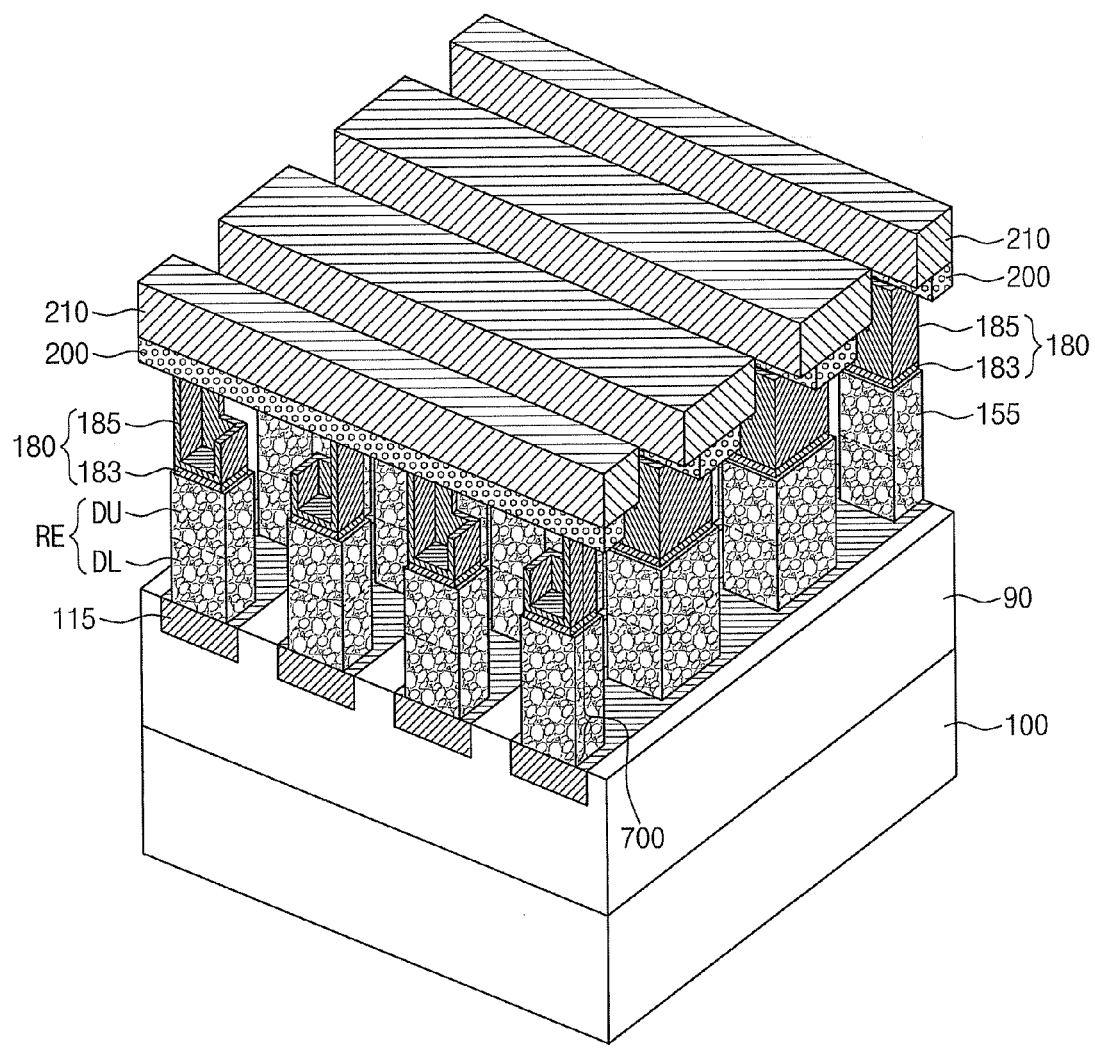

Referring to FIGS. 30 through 32, electrode structures 180, memory elements 200 and upper interconnection lines 210 may be disposed on the semiconductor patterns 155. The upper interconnection lines 210 may be disposed to cross over the device isolation trenches 105, and the memory elements 200 may be disposed on an electric current path connecting the upper interconnection line 210 with the electrode structure 180.

According to example embodiments, each of the memory elements 200 may be coupled to a plurality of the electrode structures 180 under the upper interconnection line 210. For example, as shown in FIGS. 30 and 32, each of the memory elements 200 may have a line shape crossing over the doped regions 110. According to example embodiments, the memory elements 200 may be two-dimensionally arranged on the substrate 100. For example, as shown in FIG. 31, the memory elements 200 may be disposed on the corresponding one of the semiconductor patterns 155.

Each of the electrode structures 180 may be disposed between a top surface of the corresponding one of the semiconductor patterns 155 and a bottom surface of the corresponding one of the memory elements 200. The electrode structure 180 may include an electrode pattern 185, which may be directly in contact with the bottom surface of the memory element 200. According to example embodiments, as shown in FIGS. 30 and 32, the electrode pattern 185 may have a cup shape having a bottom portion and a sidewall portion extended vertically from an edge of the bottom portion. In example embodiments, the memory element 200 may be in direct contact with a part or the entirety of a top surface of the sidewall portion. According to example embodiments, as shown in FIG. 31 or FIG. 18, the electrode pattern 185 may have a rod shape having a narrower width. In example embodiments, a maximum width of the electrode pattern 185 may be smaller than the minimum feature size of a pattern, which may be realized using a lithography process.

According to example embodiments of inventive concepts, as shown in FIG. 32, the semiconductor patterns 155 may be connected with each other by lower interconnection lines 115, which may be formed of a material having a lower resistivity than a doped silicon layer. For example, the lower interconnection lines 115 may include at least one metallic material. In addition, to separate the lower interconnection lines 115 electrically, a lower insulating layer 90 may be interposed between the lower interconnection lines 115 and the substrate 100. For example, the lower insulating layer 90 and the substrate 100 may be embodied using a silicon-on-insulator (SOI) wafer. Alternatively, the lower insulating layer 90 may be embodied using the device isolation pattern 130 in the afore-described embodiments. In addition, if the lower insulating layer 90 is formed on the substrate 100, the substrate 100 may not necessarily be formed of a semiconductor material.

The second trenches 302 may be formed across the semiconductor spacers 152 or the semiconductor lines 153. In example embodiments, as shown in FIGS. 26 through 32, a horizontal cross section of the semiconductor pattern 155 may have a substantially tetragonal shape, e.g., a rectangular or square shape, having four corners. For example, in a plan view, the four corners of the semiconductor pattern 155 may have a smaller curvature radius than a quarter of a width of the semiconductor pattern 155.

Figure 33:
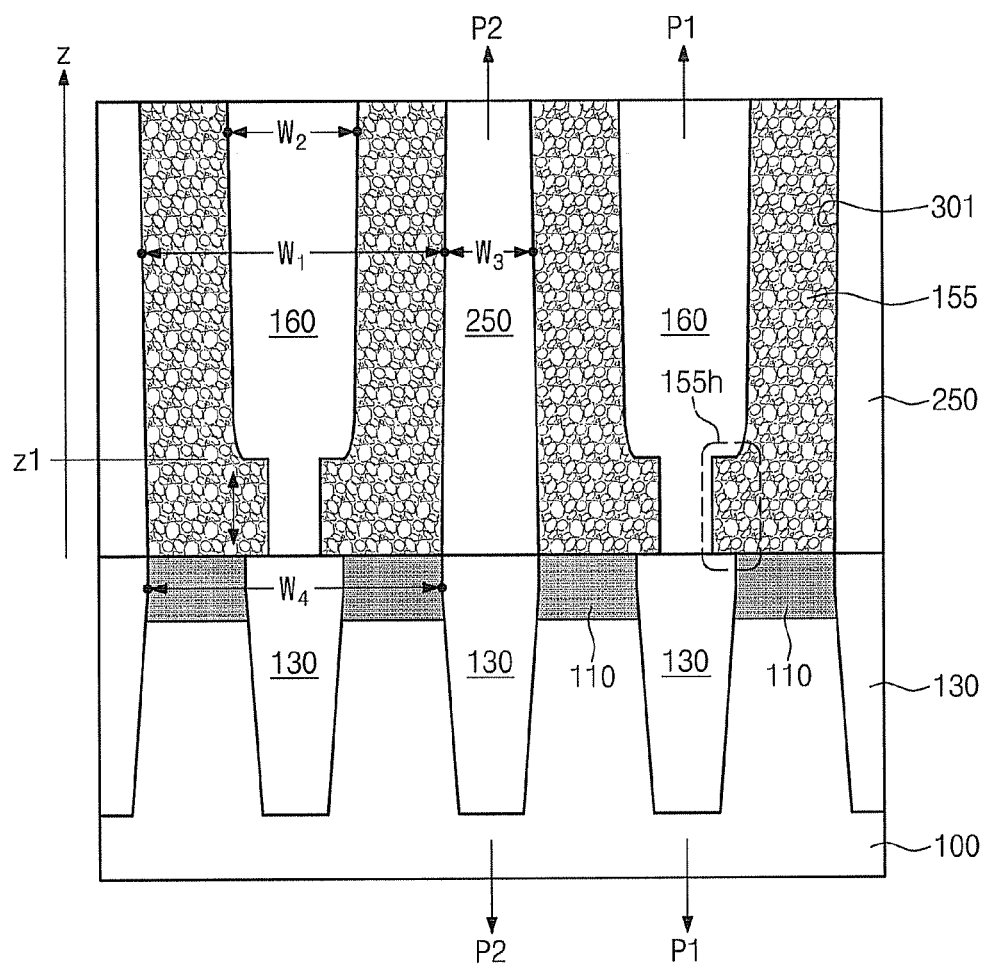
Figure 34:
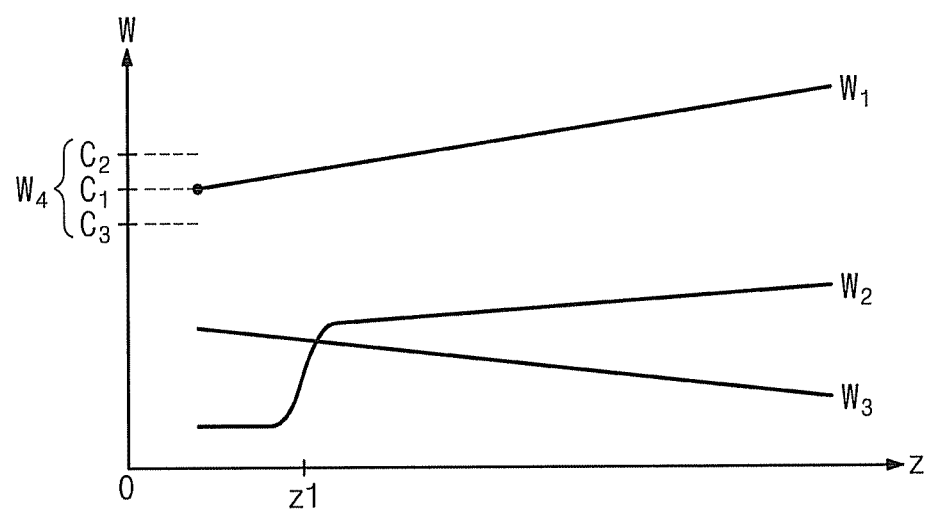

FIGS. 33 and 34 are a sectional view and a graph, respectively, provided for illustrating some aspects of semiconductor devices according to example embodiments of inventive concepts.

Referring to FIGS. 33 and 34, a width W1 of the first trench 301 may be narrower in a lower region thereof than in an upper region thereof. In FIG. 33, the width W1 of the first trench 301 may be a distance between two adjacent ones of the mold patterns 250 or between two adjacent ones of the even-numbered device isolation patterns 130b. In addition, the mold pattern 250 defining a sidewall of the first trench 301 may have an upwardly tapered shape, being wider at a lower region than at an upper region of the mold pattern 250. For example, as a distance z from the substrate 100 increases, the width $W_1$ of the first trench 301 may monotonically increase, and a width $W_3$ of the mold pattern 250 may monotonically decrease. As a result, a pair of adjacent semiconductor patterns 155 may form a pair of diodes, where each pair of diodes has outer sidewalls that form a "V" shape or substantially a "V" shape. Further, each diode of the plurality of pairs of diodes may have substantially parallel opposite side walls, that is each of the inner and outer sidewalls of an individual diode may be parallel or substantially parallel. In addition, according to example embodiments of inventive concept, a pair of the semiconductor patterns 155, which are disposed under one of the upper interconnection lines 210 in one of the first trenches 301, may not have substantially symmetry under a translational movement (e.g., sliding). For example, one of the semiconductor patterns 155 may not occupy the same space as another under a translation movement.

By contrast, the pair of the semiconductor patterns 155 may have substantially mirror symmetry. For example, as shown in FIG. 33, the pair of the semiconductor patterns 155 may have mirror symmetry with respect to a virtual plane P1 passing the center of the first trench 301. This mirror symmetry of the semiconductor patterns 155 with respect to the plane P1 may result from the fabrication method according to afore-mentioned inventive concepts, in which the pair of semiconductor patterns 155 are self-alignedly formed using the first trench 301 as a mold.

Similarly, the pair of semiconductor patterns 155 may also have mirror symmetry with respect to a virtual plane P2 passing the center of the mold pattern 250. This mirror symmetry of the semiconductor patterns 155 with respect to the plane P2 may result from the fabrication method according to afore-mentioned inventive concepts, in which the first trench 301 is defined by the mold pattern 250 or the even-numbered device isolation patterns 130b.

According to example embodiments described with reference to FIGS. 12 through 17, the mirror symmetry of the semiconductor patterns 155 may be illustrated more clearly. For example, because each of the semiconductor patterns 155 has the horizontal extension 155h as described above, the width of the semiconductor pattern 155 may be abruptly changed at a specific height z1, as shown in FIG. 33. Also, due to the mirror symmetry of the semiconductor patterns 155 with respect to the plane P1 or P2, a width $W_2$ of the first gap-fill pattern 160 (or a space between the pair of semiconductor patterns 155) may vary rapidly, e.g., two-fold, compared with a width of the semiconductor pattern 155 as shown in FIG. 33.

Patterns may have various sidewall profiles depending on fabrication methods to be used. In this sense, the widths $W_1$ to $W_4$ or the mirror symmetry of the semiconductor pattern 155 may be changed from the aforementioned features in a variety of ways.

In example embodiments, as in the case $C_1$ of FIG. 34, the width $W_1$ of the first trench 301 may be equal to the width sum $W_4$ of a pair of the active regions formed under the first trench 301 and a device isolation pattern 130 interposed between the active regions. In other example embodiments, as in the cases $C_2$ or $C_3$ of FIG. 34, the width $W_1$ of the first trench 301 may be more or less than the width $W_4$.

As shown in FIG. 6, the semiconductor patterns 155 may have sidewalls defined by the second trenches 302. Therefore, as shown in FIGS. 26 through 32, each of the semiconductor patterns 155 may have substantially mirror symmetry with respect to a plane, which is perpendicular to the doped region 110 or the lower interconnection line 115 and parallel to the upper interconnection line 210. In addition, the semiconductor patterns 155 may have translational symmetry under a translational movement along a major axis of the lower interconnection line 115.

Figure 35:
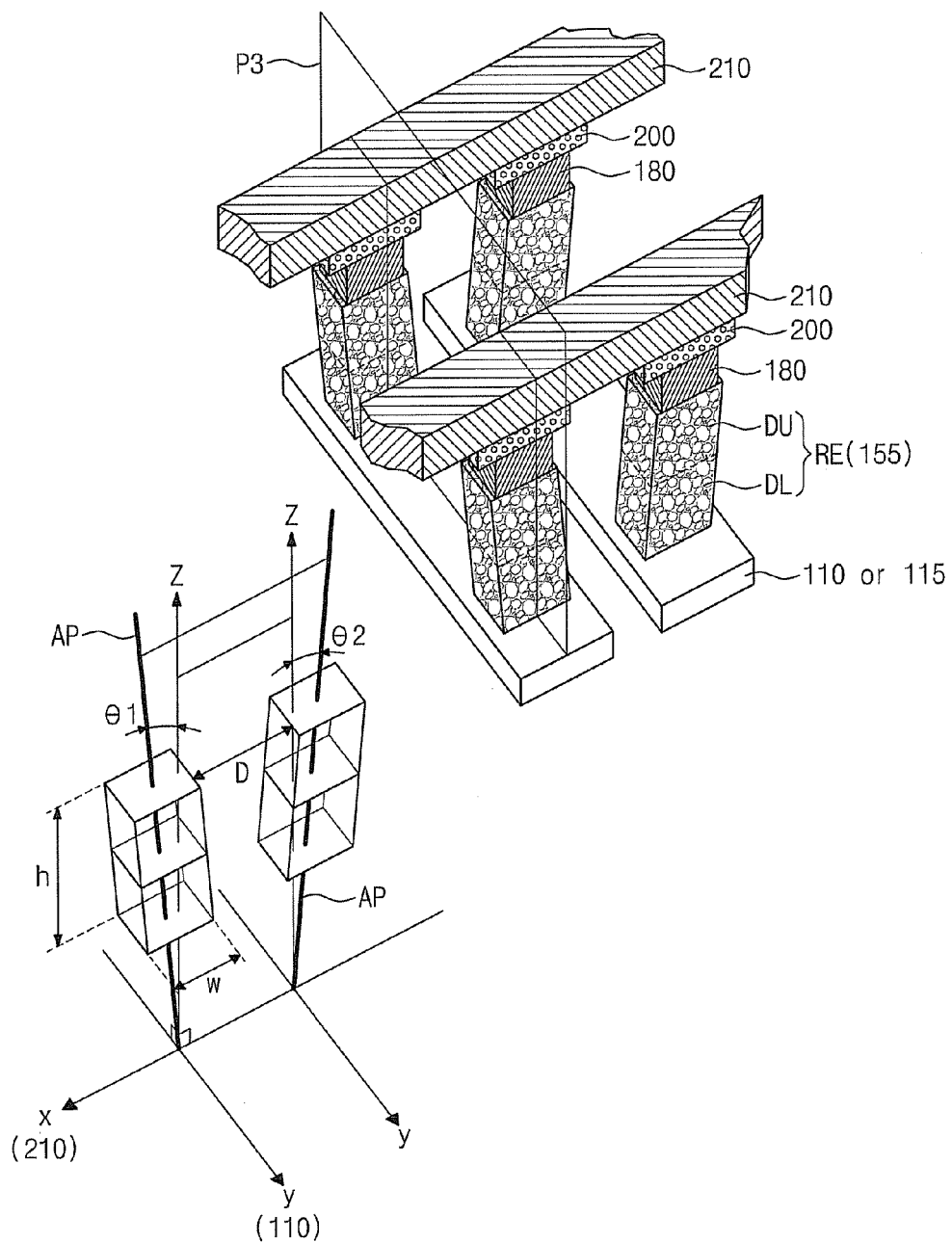

FIG. 35 is a schematic diagram illustrating other aspects of semiconductor devices according to example embodiments of inventive concepts.

Referring to FIG. 35, since the semiconductor pattern 155 may have sidewalls defined by the first trench 301, a sidewall slope or a horizontal width of the semiconductor pattern 155 may depend on a slope of an inner sidewall of the first trench 301 and/or a deposition profile of the semiconductor layer 150. Therefore, as shown in FIG. 35, each of the semiconductor patterns 155 may have asymmetry with respect to a plane P3, which is parallel to a major axis of the first trench 301 or the active region and perpendicular to the top surface of the substrate 100. The semiconductor pattern 155 may clearly exhibit this asymmetry, if it has the horizontal extension 155h as mentioned above.

A central axis AP passing the center of the semiconductor pattern 155 may not be parallel with a normal line, e.g., z-axis, to the top surface (e.g., xy-plane) of the substrate 100. That is, an angle $\theta 1$ between the central axis AP of the semiconductor pattern 155 and the normal line to the substrate 100 may not be zero. For example, the angle $\theta 1$ may be in a range of from $0°$ to $15°$; that is, $0°<\theta 1<15°$.

A non-verticality of the central axis AP of the semiconductor pattern 155 may result in a variation of a distance D between the adjacent semiconductor patterns 155. For example, the distance D may vary depending on the central axis slope $\theta 1$ and an aspect ratio h/w of the semiconductor pattern 155 and may be given by the equation $D=2\times h\times \tan(\theta 1)$, where h and w denote a height and a width of the semiconductor pattern 155, respectively. Accordingly, when the aspect ratio of the semiconductor pattern 155 is high and the central axis slope $\theta 1$ is slant with respect to the z-axis, the distance D between the adjacent semiconductor patterns 155 may be largely varied. This may cause a loss in an integration density of a semiconductor memory device.

According to example embodiments of inventive concepts, the central axis slope $\theta 1$ of the semiconductor pattern 155 may be formed to satisfy the following inequality:

$$\theta 1 < \tan^{-1}\left(\frac{w}{a\cdot h}\right),$$

where a is a parameter selected to reduce the aforesaid technical difficulties. In example embodiments, the parameter a may range from 10 to 100. In example embodiments, the variation of the distance D between the adjacent semiconductor patterns 155 and the consequential technical difficulties may reduce effectively.

In addition, in example embodiments, the pair of the semiconductor patterns 155 may have substantially mirror symmetry with respect to the plane P1 or P2, as described with reference to FIGS. 33 and 34. In example embodiments, angles between the central axes AP of them and the z-axis may be substantially equal to each other: that is, $|\theta 1/\theta 2|\sim 1$ as shown in the FIG. 35.

Figure 36:
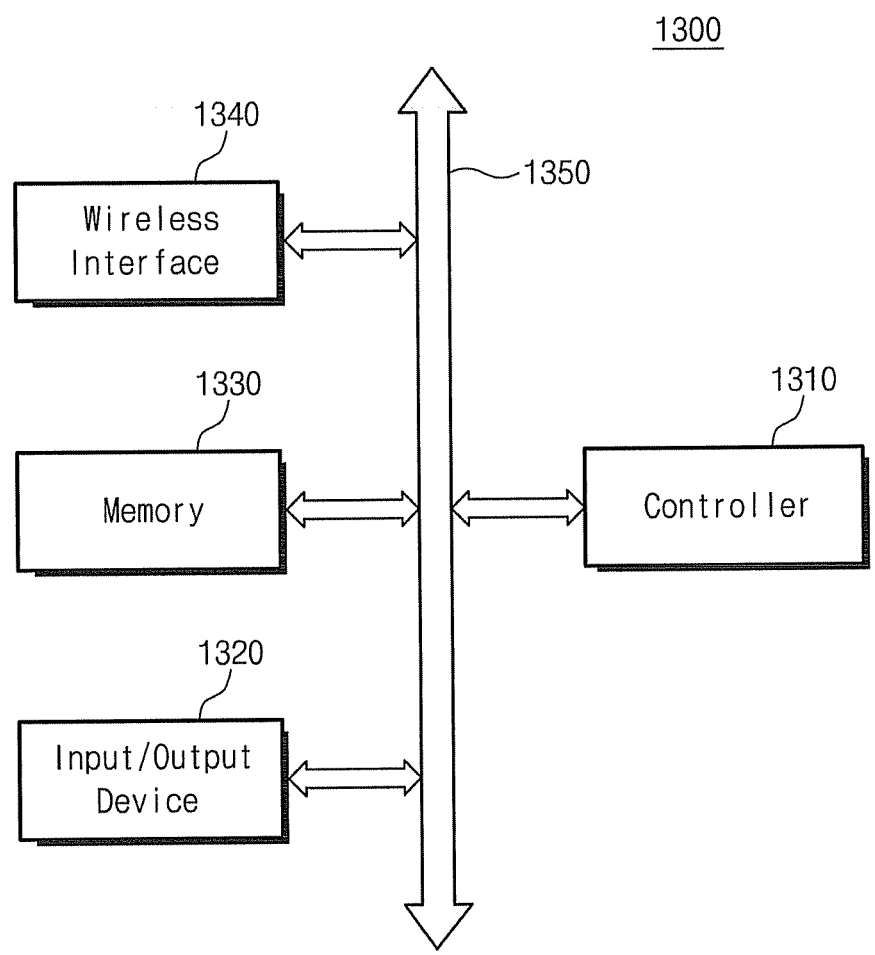
Figure 37:
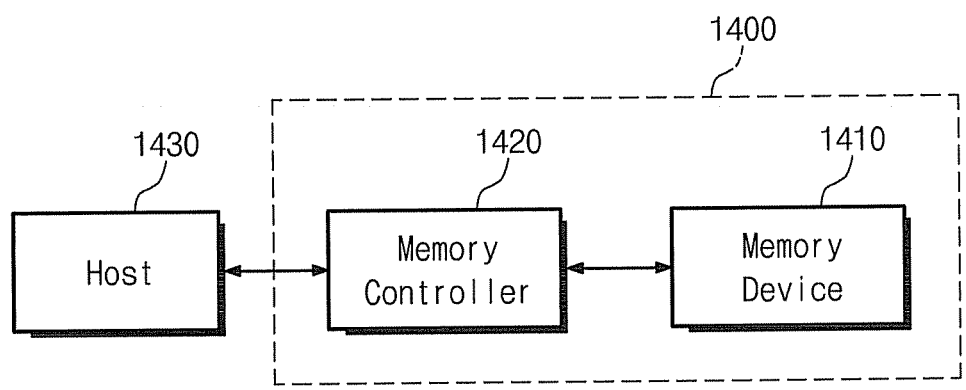

FIGS. 36 and 37 are diagrams schematically illustrating electronic devices including a semiconductor device according to example embodiments of inventive concepts.

Referring to FIG. 36, an electronic device 1300 including a semiconductor device according to example embodiments of inventive concepts will be described. The electronic device 1300 may be used in one of a PDA, a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, and CDMA2000.

Referring to FIG. 37, a memory system including a semiconductor device according to example embodiments of inventive concepts will be described. The memory system 1400 may include a memory device 1410 for storing large amounts of data and a memory controller 1420. The memory controller 1420 controls the memory device 1410 so as to read data stored in the memory device 1410 or to write data into the memory device 1410 in response to a read/write request of a host 430. The memory controller 1420 may include an address mapping table for mapping an address provided from the host 1430 (e.g., a mobile device or a computer system) into a physical address of the memory device 1410. The memory device 1410 may be a semiconductor device according to example embodiments of the inventive concepts.

When a low temperature deposition technique is used to fill a narrow gap region, it is known that technical difficulties such as a void, a seam, or an overhang may occur. However, according to example embodiments of inventive concepts, a pair of semiconductor patterns spaced apart from each other may be formed using a first trench, which has a wider width than the sum of widths of the pair of the semiconductor patterns, as a mold. Thus, a semiconductor layer, which is deposited for forming the semiconductor patterns, may be formed without the technical difficulties. That is, none of the void, the seam, and the overhang may be formed in the semiconductor patterns. As a result, the semiconductor memory device may be fabricated with improved reliability. For all that, since the pair of semiconductor patterns are formed to be spaced apart from each other in the first trench, a unit memory cell using the semiconductor pattern as a rectifying element may be realized without increase of an occupying area thereof.

In addition, as explained above, since it is possible to reduce the technical difficulties such as a void, a seam, or an overhang, a low temperature deposition technique may be used to form the semiconductor layer. Due to the use of the low temperature deposition technique, the semiconductor memory device may be fabricated with reduced thermal burden. For example, it is possible to prevent a thermal diffusion of impurity and the consequential short channel effect from occurring in transistors constituting peripheral circuits.

While example embodiments have been particularly shown and described, it will be understood by one of ordinary skill in the art that variations in form and detail may be made therein without departing from the spirit and scope of the claims.

What is claimed is:

1. A method of forming a semiconductor memory device, comprising:
    forming a plurality of diode patterns in each of a plurality of first trenches, each of the plurality of first trenches including at least two active regions, the plurality of diode patterns occupying a plurality of spaces;
    treating the plurality of diode patterns to form a plurality of semiconductor patterns in each of the plurality of spaces;
    removing portions of the plurality of semiconductor patterns to form a recess in each of the plurality of spaces;
    treating the plurality of semiconductor patterns to form a plurality of diodes in each of the plurality of spaces;
    forming a bottom electrode on each of the plurality of diodes;
    forming a plurality of memory elements on each of the bottom electrodes; and
    forming a plurality of upper interconnection lines on the plurality of memory elements.

2. The method of claim 1, wherein the plurality of diodes are in the plurality of spaces, but not in the plurality of recesses.

3. The method of claim 1, wherein each of the bottom electrodes are in each of the plurality of recesses.

4. The method of claim 1, wherein the plurality of memory elements are in the plurality of recesses.

5. The method of claim 1, wherein the plurality of memory elements are on the plurality of recesses.

6. The method of claim 1, wherein the plurality of memory elements are separated by a plurality of interlayer insulating patterns.

7. The method of claim 1, further comprising:
    forming a plurality of device isolation patterns and the plurality of active regions, the plurality of device isolation patterns being alternately disposed to expose an upper surface of at least two of the plurality of active regions within each of the plurality of first trenches;
    conformally forming a semiconductor layer on the plurality of device isolation patterns and the plurality of first trenches; and
    removing portions of the semiconductor layer to form the plurality of diode patterns on the upper surface of the at least two of the plurality of active regions within each of the plurality of first trenches.

8. The method of claim 7, wherein the semiconductor layer is made of amorphous silicon.

9. The method of claim 7, further comprising:
    annealing the semiconductor layer to form a crystalline semiconductor layer.

10. The method of claim 9, wherein the annealing of the semiconductor layer is performed at a temperature of 500-700 C.

11. The method of claim 1, further comprising:
    forming a capping layer on a semiconductor layer; and
    forming a plurality of spacers on at least a portion of the sidewalls of the plurality of diode patterns from the capping layer.

12. The method of claim 11, further comprising:
    etching a bottom of the semiconductor layer exposed between the plurality of spacers.

13. The method of claim 11, further comprising:
    annealing the semiconductor layer and the capping layer.

14. The method of claim 13, wherein the annealing is performed at a temperature of 500-700 C.

15. The method of claim 11, wherein the capping layer is formed of at least one of $SiO_2$, SiON, a metal oxide, or a metal oxynitride.

16. The method of claim 11, further comprising:
    removing the plurality of spacers.

17. The method of claim 11, further comprising:
    forming a plurality of first gap-fill patterns in the plurality of first trenches;
    removing portions of the plurality of device isolation patterns, the plurality of diode patterns, and the plurality of first gap-fill patterns to form a plurality of second trenches, perpendicular to the plurality of first trenches;
    forming a plurality of second gap-fill patterns in the plurality of second trenches; and
    forming upper regions and lower regions of the plurality of semiconductor patterns to have different conductivity types to form a plurality of diodes.

18. The method of claim 17, further comprising:
    forming a plurality of upper trenches along the plurality of device isolation patterns;
    forming a plurality of upper gap-fill patterns in the plurality of upper trenches;
    forming the plurality of memory elements separated by a plurality of interlayer insulating patterns on the plurality of upper gap-fill patterns; and
    forming the plurality of upper interconnection lines on the plurality of memory elements.

19. The method of claim 18, wherein forming the plurality of electrode structures includes forming a plurality of pillar type bottom electrodes in an interlayer dielectric layer.

20. The method of claim 1, further comprising:
    forming a plurality of device isolation patterns, a plurality of device isolation masks, and the plurality of active regions, separated by the plurality of device isolation patterns, on a substrate by shallow trench isolation;
    removing a subset of the plurality of device isolation patterns and the plurality of isolation masks within the plurality of first trenches to expose an upper surface of at least two of the plurality of active regions and an upper surface of the removed device isolation pattern within each of the plurality of first trenches;
    conformally forming a semiconductor layer on the remaining plurality of device isolation patterns and the plurality of first trenches; and
    removing portions of the semiconductor layer to form the plurality of diode patterns on the upper surface of the at least two of the plurality of active regions within each of the plurality of first trenches and to expose the upper surface of the removed device isolation pattern within each of the plurality of first trenches.

21. The method of claim 20, wherein the semiconductor layer is made of amorphous silicon.

22. The method of claim 20, further comprising:
annealing the semiconductor layer to form a crystalline semiconductor layer.

23. The method of claim 22, wherein the annealing of the semiconductor layer is performed at a temperature of 500-700° C.

24. The method of claim 22, wherein the plurality of active regions act as seed regions to form the crystalline semiconductor layer.

25. The method of claim 1, further comprising:
forming a plurality of first gap-fill patterns in the remainder of each of the plurality of first trenches;
removing portions of the remaining plurality of device isolation patterns, the plurality of diode patterns, and the plurality of first gap-fill patterns to form a plurality of second trenches, perpendicular to the plurality of first trenches;
forming a plurality of second gap-fill patterns in the plurality of second trenches;
removing upper portions of the plurality of semiconductor patterns to form the plurality of recesses;
forming upper regions and lower regions of the plurality of semiconductor patterns to have different conductivity types to form the plurality of diodes; and
forming a plurality of electrode structures on the plurality of diodes.

26. The method of claim 25, further comprising:
forming a plurality of upper trenches along the plurality of device isolation patterns;
forming a plurality of upper gap-fill patterns in the plurality of upper trenches;
forming the plurality of memory elements separated by a plurality of interlayer insulating patterns on the plurality of upper gap-fill patterns; and
forming the plurality of upper interconnection lines on the plurality of memory elements.

27. The method of claim 25, wherein forming the plurality of electrode structures includes forming a plurality of pillar type bottom electrodes in an interlayer dielectric layer.

28. The method of claim 1, further comprising:
forming a plurality of device isolation patterns and the plurality of active regions, separated by the plurality of device isolation patterns on a substrate by shallow trench isolation;
forming a plurality of mold patterns on a subset of the plurality of device isolation patterns to define the plurality of first trenches, an upper surface of at least two of the plurality of active regions and an upper surface of the remaining device isolation pattern being within each of the plurality of first trenches;
conformally forming a semiconductor layer on the plurality of mold patterns and the plurality of first trenches; and
removing portions of the semiconductor layer to form the plurality of diode patterns on the upper surface of the at least two of the plurality of active regions within each of the plurality of first trenches and to expose the upper surface of the remaining device isolation pattern within each of the plurality of first trenches.

29. The method of claim 28, wherein a thickness of the device isolation pattern is 50 to 200% of the depth of the device isolation trench.

30. The method of claim 28, a thickness of the device isolation pattern is the same as a depth of the device isolation trench.

31. The method of claim 28, further comprising:
forming a plurality of spacers on sidewalls of the plurality of diode patterns;
forming a plurality of first gap-fill patterns in the plurality of first trenches;
removing portions of the remaining plurality of device isolation patterns, the plurality of diode patterns, and the plurality of first gap-fill patterns to form a plurality of second trenches, perpendicular to the plurality of first trenches;
forming a plurality of second gap-fill patterns in the plurality of second trenches;
forming an interlayer dielectric layer including a plurality of electrodes structures, each of the plurality of electrode structures including a pad pattern connected to each of the plurality of semiconductor patterns and a electrode pattern on the corresponding pad pattern, wherein an upper surface of the plurality of electrode patterns are exposed;
forming the plurality of memory elements separated by a plurality of interlayer insulating patterns on the interlayer dielectric layer.

32. The method of claim 1, further comprising:
forming a plurality of mold patterns, with the plurality of first trenches between adjacent ones of plurality of mold patterns, on an active layer on a substrate;
conformally forming a semiconductor layer on the plurality of mold patterns and the active layer;
forming gap-fill patterns in a remainder of each of the plurality of first trenches;
removing upper portions of the semiconductor layer and the gap-fill patterns to expose an upper surface of each of the plurality of mold patterns;
removing upper portions of the semiconductor layer to form a plurality of gap regions;
forming a plurality of capping patterns in the plurality of gap regions; and
removing the gap-fill patterns, portions of the plurality of mold patterns, portions of the active layer thereunder, and portions of the substrate thereunder by shallow trench isolation to form the plurality of diode patterns.

33. The method of claim 32, wherein the active layer covers the substrate.

34. The method of claim 32, wherein the active layer is doped to have a conductivity type opposite from the conductivity type of the substrate.

35. The method of claim 32, wherein the substrate under regions of the gap-fill patterns and the plurality of mold patterns are etched to different depths.

36. The method of claim 1, further comprising:
forming an insulation layer on a substrate to form a silicon-on-insulator (SOI) structure;
forming a plurality of interconnection lines in the insulation layer;
forming a plurality of mold patterns on a subset of exposed portions of the insulation layer to define the plurality of first trenches, an upper surface of at least two of the plurality of interconnection lines and an upper surface of the remaining exposed portions of the insulation layer being within each of the plurality of first trenches;
conformally forming a semiconductor layer on the plurality of interconnection lines and the plurality of first trenches; and
removing portions of the semiconductor layer to form the plurality of diode patterns on the upper surface of the at least two of the plurality of interconnection lines within each of the plurality of first trenches and to expose the upper surface of insulation layer within each of the plurality of first trenches.

37. The method of claim 1, wherein treating the plurality of diode pattern comprises:

thermally treating the plurality of diode patterns.

38. The method of claim 37, wherein the thermally treating crystallizes the plurality of diode patterns.

39. The method of claim 37, wherein the thermally treating includes heating or annealing.

40. The method of claim 39, wherein the annealing is laser annealing.

41. The method of claim 37, wherein the thermally treating is performed in a temperature range of about 500-700 C.

42. The method of claim 37, wherein the thermally treating is performed in a nitrogen or an oxygen/nitrogen atmosphere.

43. The method of claim 37, wherein during the thermally treating, impurities from a doped region, diffuse into the plurality of diode patterns to form the plurality of semiconductor patterns.

44. The method of claim 1, wherein treating the remainder of the plurality of semiconductor patterns includes implanting ions into an upper region of the plurality of semiconductor patterns to form the plurality of diodes.

45. The method of claim 44, wherein a substrate and upper regions of the plurality of semiconductor patterns have a first conductivity type and lower regions of the plurality of semiconductor patterns have a second conductivity type.

46. The method of claim 45, wherein the first conductivity type is n-type and the second conductivity type is p-type.

47. The method of claim 45, wherein the first conductivity type is p-type and the second conductivity type is n-type.

48. The method of claim 25, wherein a plurality of device isolation patterns are field isolation patterns and the plurality of first gap-fill patterns are upper device isolation patterns.

49. The method of claim 48, wherein the plurality of device isolation patterns and the plurality of first gap-fill patterns are aligned.

50. The method of claim 12, wherein a plurality of device isolation patterns are field isolation patterns and the plurality of first gap-fill patterns are upper device isolation patterns.

51. The method of claim 50, wherein the plurality of device isolation patterns and the plurality of first gap-fill patterns are aligned.

52. The method of claim 32, wherein a plurality of device isolation patterns are field isolation patterns and the plurality of first gap-fill patterns are upper device isolation patterns.

53. The method of claim 52, wherein the plurality of device isolation patterns and the plurality of first gap-fill patterns are a single body.

54. A method of forming a memory device, the method comprising:

disposing a semiconductor layer in a plurality of first trenches on a substrate;

annealing the semiconductor layer;

patterning the semiconductor layer to form a plurality of semiconductor patterns;

forming upper regions and lower regions of the plurality of semiconductor patterns to have different conductivity types to form a plurality of diodes; and forming an electrode on the plurality of diodes with a memory element thereon, wherein patterning the semiconductor layer includes forming a plurality of second trenches crossing the first trenches.

* * * * *